United States Patent
Ahn et al.

(10) Patent No.: US 9,553,201 B2
(45) Date of Patent: *Jan. 24, 2017

(54) THIN FILM TRANSISTOR, THIN FILM TRANSISTOR ARRAY PANEL, AND MANUFACTURING METHOD OF THIN FILM TRANSISTOR

(71) Applicants: Samsung Display Co., Ltd., Yongin, Gyeonggi-Do (KR); Kobe Steel, Ltd., Kobe-shi, Hyogo (JP)

(72) Inventors: Byung Du Ahn, Hwaseong-si (KR); Ji Hun Lim, Goyang-si (KR); Gun Hee Kim, Hwaseong-si (KR); Kyoung Won Lee, Ansan-si (KR); Je Hun Lee, Seoul (KR); Hiroshi Goto, Kobe (JP); Aya Miki, Kobe (JP); Shinya Morita, Kobe (JP); Toshihiro Kugimiya, Kobe (JP); Yeon Hong Kim, Yongin (KR); Yeon Gon Mo, Yongin (KR); Kwang Suk Kim, Yongin (KR)

(73) Assignees: Samsung Display Co., Ltd. (KR); Kobe Steel, Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/179,452

(22) Filed: Feb. 12, 2014

(65) Prior Publication Data

US 2014/0167038 A1   Jun. 19, 2014

Related U.S. Application Data

(63) Continuation-in-part of application No. 13/555,889, filed on Jul. 23, 2012, now Pat. No. 8,686,426.

(30) Foreign Application Priority Data

Apr. 2, 2012   (KR) .......................... 10-2012-0034101
Sep. 10, 2013   (KR) .......................... 10-2013-0108687

(51) Int. Cl.
*H01L 27/14*   (2006.01)
*H01L 29/786*   (2006.01)

(52) U.S. Cl.
CPC ..... *H01L 29/7869* (2013.01); *H01L 29/78696* (2013.01)

(58) Field of Classification Search
CPC .......................... H01L 27/1222; H01L 21/7806
(Continued)

(56) References Cited

U.S. PATENT DOCUMENTS 5,972,527 A   10/1999   Kaijou et al.
6,727,522 B1   4/2004   Kawasaki et al.
(Continued)

FOREIGN PATENT DOCUMENTS

CN   101548389 A   9/2009
CN   101673770 A   3/2010
(Continued)

OTHER PUBLICATIONS

European Search Report corresponding to European Patent Application No. 12191169.7, Sep. 30, 2013, 6 pages.

*Primary Examiner* — Tan N Tran
(74) *Attorney, Agent, or Firm* — Innovation Counsel LLP

(57) ABSTRACT

The inventive concept relates to a thin film transistor and a thin film transistor array panel and, in detail, relates to a thin film transistor including an oxide semiconductor. A thin film transistor according to an exemplary embodiment of the inventive concept includes: a gate electrode; a gate insulating layer positioned on or under the gate electrode; a first semiconductor and a second semiconductor that overlap the gate electrode with the gate insulating layer interposed therebetween, the first semiconductor and the second semiconductor contacting each other; a source electrode connected to the second semiconductor; and a drain electrode
(Continued)

connected to the second semiconductor and facing the source electrode, wherein the second semiconductor includes gallium (Ga) that is not included in the first semiconductor, and a content of gallium (Ga) in the second semiconductor is greater than 0 at. % and less than or equal to about 33 at. %.

17 Claims, 25 Drawing Sheets

(58) Field of Classification Search
USPC .................................. 257/59, 72, 258, 432
See application file for complete search history.

(56) References Cited

U.S. PATENT DOCUMENTS

| | | | |
|---|---|---|---|
| 6,878,962 B1 | 4/2005 | Kawasaki et al. | |
| 7,061,014 B2 | 6/2006 | Hosono et al. | |
| 7,067,843 B2 | 6/2006 | Carcia et al. | |
| 7,145,174 B2 | 12/2006 | Chiang et al. | |
| 7,189,992 B2 | 3/2007 | Wager, III et al. | |
| 7,211,825 B2 | 5/2007 | Shih et al | |
| 7,242,039 B2 | 7/2007 | Hoffman et al. | |
| 7,262,463 B2 | 8/2007 | Hoffman | |
| 7,297,977 B2 | 11/2007 | Hoffman et al. | |
| 7,339,187 B2 | 3/2008 | Wager, III et al. | |
| 7,393,600 B2 | 7/2008 | Inoue et al. | |
| 7,564,055 B2 | 7/2009 | Hoffman | |
| 7,994,579 B2 | 8/2011 | Itai | |
| 8,053,836 B2 | 11/2011 | Yeh et al. | |
| 8,319,905 B2 * | 11/2012 | Yoon ..................... G02F 1/1368 257/43 | |
| 8,686,426 B2 * | 4/2014 | Ahn ..................... H01L 29/7869 257/258 | |
| 2005/0017244 A1 | 1/2005 | Hoffman et al. | |
| 2006/0108636 A1 | 5/2006 | Sano et al. | |
| 2006/0113536 A1 | 6/2006 | Kumomi et al. | |
| 2006/0113549 A1 | 6/2006 | Den et al. | |
| 2006/0113565 A1 | 6/2006 | Abe et al. | |
| 2007/0023750 A1 | 2/2007 | Chiang et al. | |
| 2007/0052025 A1 | 3/2007 | Yabuta | |
| 2007/0194379 A1 | 8/2007 | Hosono et al. | |
| 2008/0254569 A1 | 10/2008 | Hoffman et al. | |
| 2009/0090914 A1 | 4/2009 | Yano et al. | |
| 2009/0189153 A1 | 7/2009 | Iwasaki et al. | |
| 2009/0236596 A1 | 9/2009 | Itai | |
| 2009/0267064 A1 | 10/2009 | Yano et al. | |
| 2009/0278122 A1 | 11/2009 | Hosono et al. | |
| 2009/0280600 A1 | 11/2009 | Hosono et al. | |
| 2010/0038641 A1 | 2/2010 | Imai | |
| 2010/0051935 A1 | 3/2010 | Lee et al. | |
| 2010/0051937 A1 | 3/2010 | Kaji et al. | |
| 2010/0059746 A1 | 3/2010 | Itai et al. | |
| 2010/0109003 A1 | 5/2010 | Akimoto et al. | |
| 2010/0193783 A1 * | 8/2010 | Yamazaki et al. ............. 257/43 | |
| 2010/0213459 A1 | 8/2010 | Shimada et al. | |
| 2010/0264412 A1 * | 10/2010 | Yamazaki et al. ............. 257/43 | |
| 2010/0289020 A1 | 11/2010 | Yano et al. | |
| 2011/0057185 A1 | 3/2011 | Peng et al. | |
| 2011/0073856 A1 | 3/2011 | Sato et al. | |
| 2011/0127523 A1 * | 6/2011 | Yamazaki ..................... 257/43 | |
| 2011/0141076 A1 | 6/2011 | Fukuhara et al. | |
| 2011/0180793 A1 | 7/2011 | Taniguchi | |
| 2011/0215328 A1 * | 9/2011 | Morosawa ............ H01L 29/786 257/59 | |
| 2011/0227064 A1 | 9/2011 | Park et al. | |
| 2012/0012840 A1 * | 1/2012 | Korthuis ............. H01L 29/7869 257/43 | |
| 2012/0018720 A1 * | 1/2012 | Park et al. ..................... 257/43 | |
| 2012/0168743 A1 | 7/2012 | Lee et al. | |
| 2012/0228133 A1 * | 9/2012 | Itose et al. ............... 204/298.13 | |
| 2013/0032798 A1 | 2/2013 | Miki et al. | |

FOREIGN PATENT DOCUMENTS

| | | |
|---|---|---|
| EP | 2092569 | 6/2008 |
| EP | 2161756 A1 | 3/2010 |
| JP | 05-251705 A | 9/1993 |
| JP | 2008-041695 A | 2/2008 |
| JP | 2008-166716 A | 7/2008 |
| JP | 4164562 B2 | 8/2008 |
| JP | 4170454 B2 | 8/2008 |
| JP | 2009-099944 A | 5/2009 |
| JP | 2009-123957 A | 6/2009 |
| JP | 2009-135380 A | 6/2009 |
| JP | 2010-045263 A | 2/2010 |
| JP | 2010-050165 A | 3/2010 |
| JP | 2010-067710 A | 3/2010 |
| JP | 2010-067954 A | 3/2010 |
| JP | 2010-161339 A | 7/2010 |
| JP | 2010-186994 A | 8/2010 |
| JP | 2010-248547 A | 11/2010 |
| JP | 2010-267955 A | 11/2010 |
| JP | 2011-187506 A | 9/2011 |
| JP | 2012-231114 A | 11/2012 |
| JP | 2013-207100 A | 10/2013 |
| KR | 1020080069607 A | 7/2008 |
| KR | 1020090089444 A | 8/2009 |
| KR | 1020090089450 A | 8/2009 |
| KR | 1020090101828 A | 9/2009 |
| KR | 10 1052241 | 7/2011 |
| KR | 10-1088366 | 11/2011 |
| KR | 1020110124530 A | 11/2011 |
| KR | 1020110128038 A | 11/2011 |
| WO | 03/040441 A1 | 5/2003 |
| WO | 2007/032294 A1 | 3/2007 |
| WO | 2008/069056 A1 | 6/2008 |
| WO | 2008/069255 A1 | 6/2008 |
| WO | 2008/117810 A1 | 10/2008 |
| WO | 2009/041544 A1 | 4/2009 |
| WO | 2011/105343 A1 | 9/2011 |
| WO | 2011132644 | 10/2011 |

* cited by examiner

THIN FILM TRANSISTOR, THIN FILM TRANSISTOR ARRAY PANEL, AND MANUFACTURING METHOD OF THIN FILM TRANSISTOR

CROSS-REFERENCE TO RELATED APPLICATION

This application is a Continuation-in-Part of U.S. patent application Ser. No. 13/555,889, filed on Jul. 23, 2012, which claims priority to and the benefit of Korean Patent Application No. 10-2012-0034101 filed in the Korean Intellectual Property Office on Apr. 2, 2012 and Korean Patent Application No. 10-2013-0108687 filed in the Korean Intellectual Property Office on Sep. 10, 2013, the entire contents of which are incorporated herein by reference.

BACKGROUND (a) Field of Disclosure

Embodiments of the inventive concept relate to a thin film transistor, a thin film transistor array panel, and a manufacturing method of a thin film transistor, and in detail, relates to a thin film transistor including an oxide semiconductor and a manufacturing method of a thin film transistor.

(b) Description of Related Technology

Electric elements such as resistors, capacitors, diodes, and thin film transistors (TFT) are used in various fields. Among these, the thin film transistors (TFT) in particular is often used for defining switching and driving elements in a flat panel display apparatus such as a liquid crystal display (LCD), an organic light emitting device (organic light emitting diode (OLED) display), and an electrophoretic display. Within the structure of the TFT, the semiconductive portion thereof is an important part for determining behavior characteristics of the TFT. Currently, silicon (Si) is widely used as the semiconductor in the TFT and other electric elements that need a semiconductive portion. The utilized silicon may be an amorphous silicon type or a polysilicon type or a monocrystalline type depending on the crystallization micro-structure of the semiconductive material. Monocrystalline silicon tends to be the most difficult to mass produce whereas the amorphous silicon type has a comparatively simpler manufacturing process. However, the amorphous silicon type has a comparatively and undesirably low, charge-carrier mobility such that there is a limit to using it for manufacturing a high performance (e.g., high switching speed) thin film transistor. Between the relatively poor performance of the amorphous silicon type and the relatively superior performance of the monocrystalline silicon type, there is the polysilicon type which has higher charge-carrier mobility than that of amorphous silicon. However, the process of crystallizing amorphous silicon to form polysilicon requires a great deal of time, energy and manufacturing cost. Also, because the crystallizing step increases process complexity, the possibility of defects during mass production that employs such a crystallizing step may increase. Thus, semiconductive oxides which use a metal oxide having semiconductive properties are coming into favor because it does not require the process of crystallization to get the higher charge-carrier mobility. Semiconductive oxides require a lower cost and higher uniformity as compared with polycrystalline silicon as well as higher charge-carrier mobility and a relatively high ON/OFF ratio as compared with amorphous silicon. The electrical characteristics of thin film transistors of the semiconductive oxide type may be greatly affected by the micro-structure and uniformity of the semiconductive oxide material, where the latter may be affected by the process used to make the semiconductive oxide material. Accordingly, research on the micro-structure and the process of forming thin film transistors using the semiconductive oxide material has been ongoing. It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The inventive concept improves electrical characteristics such as photovoltaic reliability and mobility of a thin film transistor including an oxide semiconductor, and simplifies a manufacturing process thereof.

The inventive concept eliminates a defect of a thin film transistor including an oxide semiconductor.

A thin film transistor according to an exemplary embodiment of the inventive concept includes: a gate electrode; a gate insulating layer positioned on or under the gate electrode; a first semiconductor and a second semiconductor that overlap the gate electrode with the gate insulating layer interposed therebetween, the first semiconductor and the second semiconductor contacting each other; a source electrode connected to the second semiconductor; and a drain electrode connected to the second semiconductor and facing the source electrode, wherein the second semiconductor includes gallium (Ga) that is not included in the first semiconductor, and a content of gallium (Ga) in the second semiconductor is greater than 0 at. % and less than or equal to about 33 at. %.

The first semiconductor and the second semiconductor may respectively include indium (In)-tin (Sn)-zinc (Zn) oxide (IZTO).

A content ratio of zinc (Zn) to tin (Sn) included in the first semiconductor may be substantially the same as a content ratio of zinc (Zn) to tin (Sn) included in the second semiconductor.

Etching rates of the first semiconductor and the second semiconductor in a same etchant may be substantially the same.

A thin film transistor according to an exemplary embodiment of the inventive concept includes: a gate electrode; a semiconductive layer overlapping the gate electrode with a gate insulating layer interposed between the gate electrode and the semiconductive layer, wherein the semiconductive layer includes a first semiconductor and a second semiconductor, the first semiconductor and the second semiconductor contacting each other; a source electrode connected to the second semiconductor; and a drain electrode connected to the second semiconductor and facing the source electrode, wherein the first semiconductor and the second semiconductor include tin and zinc, and wherein a content ratio of zinc (Zn) to tin (Sn) included in the first semiconductor is substantially the same as a content ratio of zinc (Zn) to tin (Sn) included in the second semiconductor.

The second semiconductor may include gallium (Ga) that is not included in the first semiconductor, and a content of gallium (Ga) in the second semiconductor may be greater than 0 at. % and less than or equal to about 33 at. %.

The first semiconductor and the second semiconductor may respectively include indium (In)-tin (Sn)-zinc (Zn) oxide (IZTO).

Etching rates of the first semiconductor and the second semiconductor in a same etchant may be substantially the same.

A thin film transistor array panel according to an exemplary embodiment of the inventive concept includes the above thin film transistor.

DETAILED DESCRIPTION OF THE EMBODIMENTS

Figure 1:
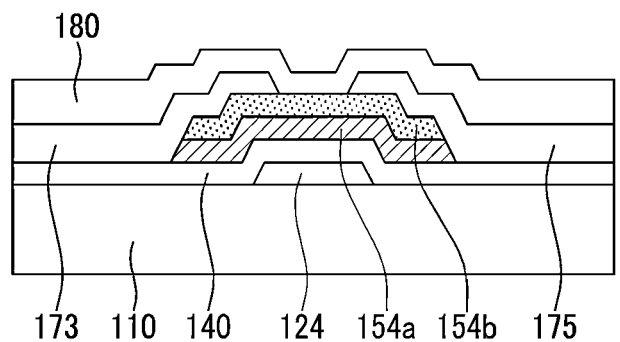
FIG. 1 is a cross-sectional view of a semiconductive oxide thin film transistor (sos-TFT) according to an exemplary embodiment in accordance with the present disclosure.
Figure 2:
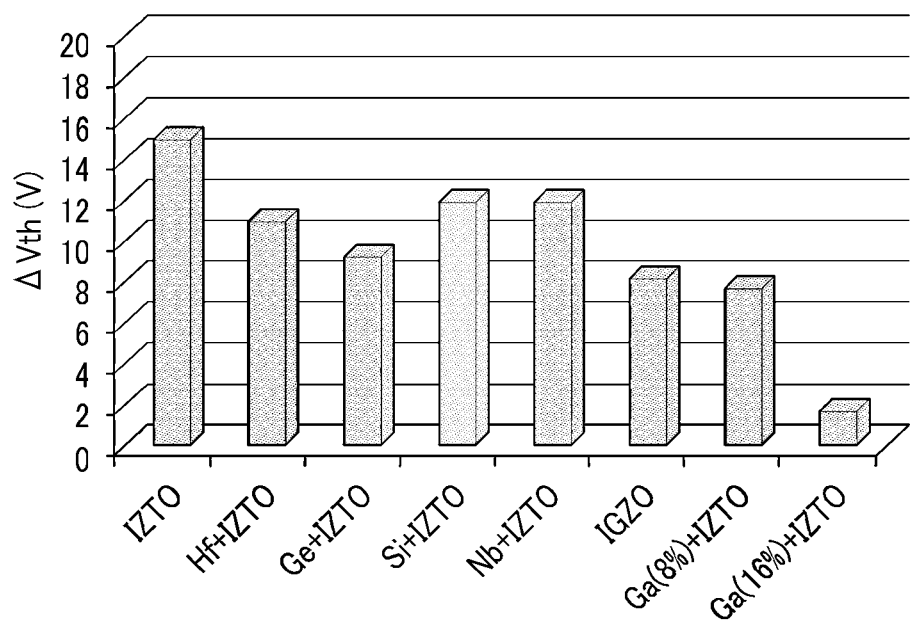
FIG. 2 is a bar graph showing respective photoelectronic reliabilities of thin film transistors made according to various exemplary embodiments including those for semiconductive oxide TFT's (sos-TFT's) of the present disclosure.
Figure 3:
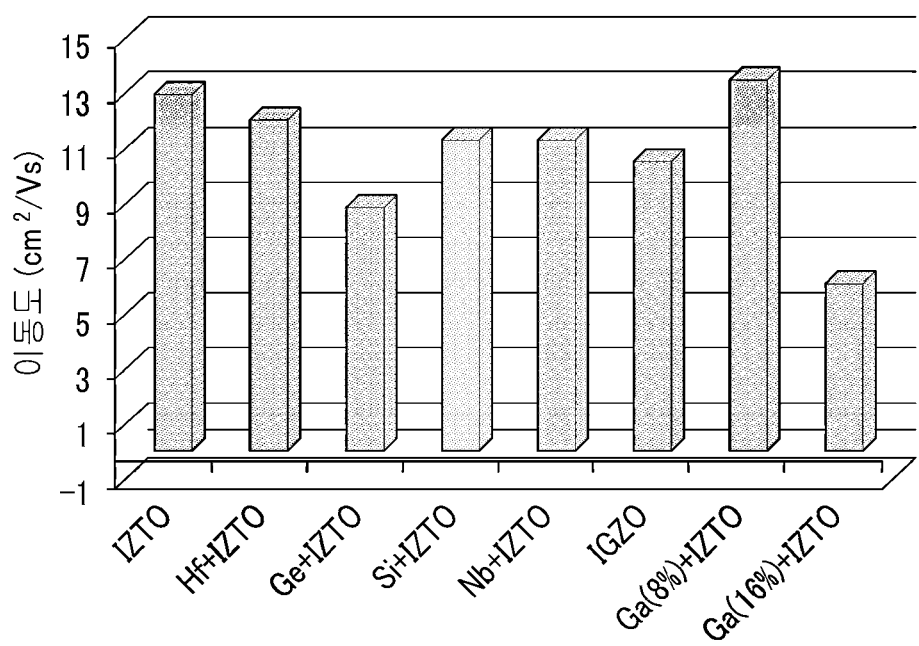
FIG. 3 is a bar graph showing respective charge-carrier mobilities of thin film transistors made according to various exemplary embodiments including those for semiconductive oxide TFT's (sos-TFT's) of the present disclosure.

The present disclosure of the inventive concept will be described more fully hereinafter with reference to the accompanying drawings, in which exemplary embodiments of the disclosure are shown. As those skilled in the pertinent art would realize after appreciating the present disclosure, the described embodiments may be modified in various different ways, all without departing from the spirit or scope of the teachings of the present disclosure. In the drawings, the thickness of layers, films, panels, regions, etc., may be exaggerated for clarity. (One exception is the included micrographs which are to scale.) Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Firstly, a thin film transistor according to an exemplary embodiment of the present disclosure will be described with reference to FIG. 1, FIG. 2, and FIG. 3. FIG. 1 is a cross-sectional view of a thin film transistor according to an exemplary embodiment of the present disclosure, FIG. 2 is a graph showing photoelectronic reliability of different thin film transistors formed according to various exemplary embodiments of the present disclosure, and FIG. 3 is a graph of charge carrier mobility of thin film transistors formed according to various exemplary embodiments of the present disclosure. Referring to the cross sectional view of FIG. 1, a gate electrode 124 is positioned on a substrate 110 including a relatively transparent insulating material such as plastic or glass. The gate electrode 124 may be made of a conductive material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). However, the gate electrode 124 may be made of a multilayered structure including at least two conductive layers having different physical properties. For example, the gate electrode 124 may have a multilayered structure such as Mo/Al/Mo, Mo/Al, Mo/Cu, CuMn/Cu, and Ti/Cu. A first semiconductive element 154a and a second semiconductive element 154b which is different from the first semiconductive element 154a are provided. Each of the semiconductive elements, 154a and 154b respectively includes a semiconductive oxide having different composition. The first semiconductive element 154a overlaps the gate electrode 124 while having a gate insulating layer 140 interposed therebetween. The second semiconductive element 154b overlaps the first semiconductive element 154a. The first semiconductive element 154a and the second semiconductive element 154b directly contact each other such that they are electrically and physically connected. Here, the first semiconductive element 154a is also referred to as a first semiconductive oxide layer and have a lower major surface interfacing with a top major surface of the gate insulating layer 140. In the present exemplary embodiment, the gate insulating layer 140 may be positioned on the gate electrode 124. The gate insulating layer 140 may include an insulating material such as a silicon oxide (SiOx), a silicon nitride (SiNx), or a silicon oxynitride (SiOxNy). The gate insulating layer 140 may be formed through a sputtering method. In general, and as a result of the sputtering process, the gate insulating layer 140 will typically have an amorphous microstructure. As mentioned the first semiconductive element 154a and the second semiconductive element 154b are disposed on the gate insulating layer 140. In an exemplary embodiment of the present disclosure shown in FIG. 1, the second semiconductive element 154b is positioned directly on the first semiconductive element 154a, and plan view shapes (not shown) of the first semiconductive element 154a and the second semiconductive element 154b may be substantially the same or similar to each other. The first semiconductive element 154a may have protrusion protruded from the edge of the first semiconductive element 154a. The protrusion may surround the first semiconductive element 154a in a plan view. Here, the plan view shapes means a section viewed from the top. The respective semiconductive oxides of the first semiconductive element 154a and the second semiconductive element 154b have different compositions. In detail, the second semiconductive element 154b includes at least one additional element, X that is not included in the first semiconductive element 154a. The additional element X comprises at least one of gallium (Ga), silicon (Si), niobium (Nb), hafnium (Hf), and germanium (Ge). The first semiconductive element 154a that lies directly on the typically amorphous microstructure of the gate insulating layer 140 is formulated not to include the predetermined element X which is included in the second element 154b. The second semiconductive element 154b may or may not include indium (In) which is included in the first semiconductive material 154a. Detailed possible compositions of the first semiconductive element 154a and the second semiconductive element 154b will be described below. According to its various formulations in accordance with the present disclosure, the first semiconductive element 154a may include at least one oxide selected from the group consisting of indium (In), tin (Sn), and zinc (Zn). The first semiconductive element 154a may include all oxides formed from indium (In), tin (Sn), and zinc (Zn). The first semiconductive element 154a may include an indium-zinc-tin oxide compound. For example, the first semiconductive element 154a may include a mixture of the following compounds: indium oxide ($In_2O_3$), zinc oxide (ZnO), and tin oxide ($SnO_2$). On the other hand, the second semiconductive element 154b may include at least one additional element X of gallium (Ga), silicon (Si), niobium (Nb), hafnium (Hf), or germanium (Ge). The second semiconductive element 154b may not include indium (In) and just include a zinc (Zn)-and tin (Sn) as its non-X components. However, the second semiconductive element 154b may include indium (In) as its non-X components. More specifically, for one example, the second semiconductive element 154b may include a mixture of indium oxide ($In_2O_3$), zinc oxide (ZnO), tin oxide ($SnO_2$), and gallium oxide ($Ga_2O_3$). Therefore, according to one aspect of the present disclosure, the second semiconductive element 154b may include tin-zinc oxide and at least one of gallium, silicon, niobium, hafnium, and germanium oxide. The composition of the second semiconductive element 154b may be formed through an AC or DC sputtering process that sputters said composition on top of the first semiconductive element 154a using an appropriate semiconductive oxide target including gallium Ga, Tin Sn, Zinc Zn and optionally indium In. A resistivity of the semiconductive oxide target used for forming the second semiconductive element 154b may be equal to or less than about $5 \times 10^{-2}$ Ωcm. For example, the, AC or DC sputtering process may be performed in an Ar atmosphere, an $O_2$ atmosphere, or an Ar and $O_2$ atmosphere. When the second semiconductive element 154b includes indium, a content (at. %) of indium among the constituents forming the second semiconductive element 154b may be substantially the same as a content (at. %) of indium included in the first semiconductive element 154a. The first semiconductive element 154a and the second semiconductive element 154b according to this composition can be simultaneously wet-etched by an etchant usable for wet-etching a metal such as copper (Cu). This metal such as copper may be a composition material of wiring that may be deposited on the layer of the second semiconductive element 154b. A difference between etch rates of the first semiconductive element 154a and the second semiconductive element 154b for the etchant may be equal to or less than about 100 Å/s, and more in detail, it may be equal to or less than about 10 Å/s. When the difference between etch rates of the first semiconductive element 154a and the second semiconductive element 154b for the given etchant is more than about 10 Å/s, the edges of the patterned first semiconductive element 154a and second semiconductive element 154b are not well aligned such that a skew may be generated and an undercut may be generated in one of the first semiconductive element 154a and the second semiconductive element 154b, and in a worse case, simultaneous patterning of both of the first semiconductive element 154a and the second semiconductive element 154b may be impossible in a practical sense. However, according to an exemplary embodiment of the present disclosure, when simultaneously patterning the first semiconductive element 154a and the second semiconductive element 154b through wet-etching with the given etchant, the skew and the undercut to the first semiconductive element 154a and the second semiconductive element 154b may be substantially prevented, thereby allowing for substantial self-aligning of the pattern edges of both to a common mask pattern. As part of a method for making the difference between the etch rates of the first semiconductive element 154a and the second semiconductive element 154b for the chosen etchant to be equal to or less than about 100 Å/s, a difference between the content of tin (Sn) included in the second semiconductive element 154b and the content of tin (Sn) included in the first semiconductive element 154a may be made equal to or less than about 15 at. %. According to an exemplary embodiment of the present disclosure, a content of the at least one additional element X included in the second semiconductive element 154b may be in a range from about 1 at. % to about 30 at. %. As described above, relatively high charge-carrier mobility may be realized while increasing photoelectronic reliability of the thin film transistor by including both of the first semiconductive element 154a and the second semiconductive element 154b for defining a channel portion of the sos-TFT. This aspect will be described with reference to FIG. 2 and FIG. 3. FIG. 2 shows photoelectronic reliability as characterized by a shift of a threshold voltage (ΔVth) of semiconductive oxide thin film transistors (sos-TFT's) according to the composition of the second semiconductive element 154b. It is to be understood that as the shift of the threshold voltage (ΔVth) of the thin film transistors decreases, the photoelectronic reliability increases. In FIG. 2, IZTO and IGZO are included as comparative examples, and the other illustrated compositions are those of the second semiconductive element 154b which include the additional element X in accordance with the present disclosure. Referring to FIG. 2 the photoelectronic reliability of the semiconductive oxide thin film transistor (sos-TFT) including the additional element X is relatively excellent as compared with IZTO which does not include the additional element X. More specifically, the photoelectronic reliability may be made exceptionally good (smallest shift and thus best predictability for electrical behavior) when the additional element X is gallium (Ga) and the content of that additional element X (e.g., gallium (Ga)) in the second semiconductive element 154b is about 16 at. % as compared to cases where the content of that additional element X (e.g., gallium (Ga)) is substantially less than 16 at. %. Accordingly, for the sake of providing relatively good predictability for electrical behavior of semiconductive oxide transistors (sos-TFT's) where the shift of the threshold voltage (ΔVth) is minimized, it is desirable to use, as an example, the Ga (16 at. %)+IZTO composition shown at the far right of the bar graph of FIG. 2. On the other hand, and as shown in FIG. 3, the same exemplary Ga (16 at. %)+IZTO composition shown at the far right of the bar graph of FIG. 3 performs comparatively worst in terms of charge-carrier mobility (cm2/Vs). Both of the cases of FIG. 2 and FIG. 3, the IZTO and IGZO compositions are included as comparative examples, and the rest of the illustrated cases in the graph represent exemplary compositions for the second semiconductive element 154b in accordance with the present disclosure where such compositions include the at least one additional element X (e.g., gallium Ga). Referring to the details of FIG. 3, it can be seen that IZTO with no additional element X has substantially superior charge-carrier mobility than IZTO including 16 at. % of Ga. More specifically, it is observed that IZTO including 8 at. % of Ga has charge-carrier mobility greater than IZTO including no Ga (at. % of Ga=0%). On the other hand, charge-carrier mobility appears to decrease substantially when IZTO includes 16% at. % of Ga. In other words, the charge-carrier mobility may be undesirably low when the content of the additional element X (e.g., gallium (Ga)) of the second semiconductive element 154b is about 16 at. % or higher. By contrast, the charge-carrier mobility may be acceptable in cases where the content of the additional element X (e.g., Ga) is less than 16 at. %, for example 8 at. % or less. In view of the above, and in accordance with an exemplary embodiment of the present disclosure, when the second semiconductive element 154b includes at least one additional element X (where the additional element X includes at least one of gallium (Ga), silicon (Si), niobium (Nb), hafnium (Hf), and germanium (Ge)) for the purpose of reducing the shift of the threshold voltage (ΔVth) in accordance with FIG. 2, the first semiconductive element 154a may be formed with substantially less or none of the additional element X for the purpose of increasing the charge-carrier mobility provided by the first semiconductive element 154a.

Figure 4:
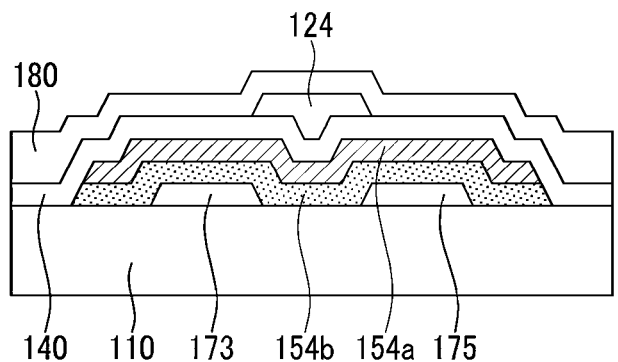
FIG. 4 is a cross-sectional view of a second thin film transistor according to an exemplary embodiment of the present disclosure.
Figure 5:
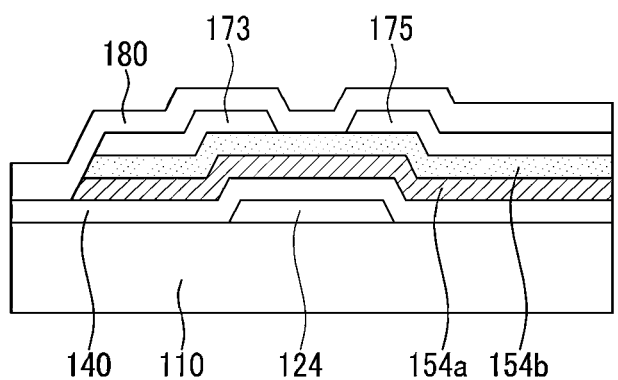
FIG. 5 is a cross-sectional view of another semiconductive oxide TFT (sos-TFT) according to an exemplary embodiment of the present disclosure.
Figure 6:
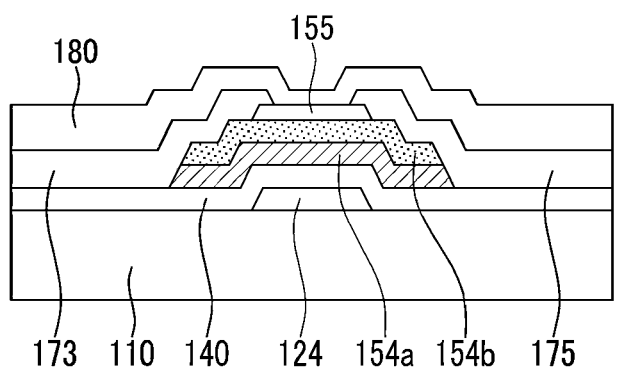
FIG. 6 is a cross-sectional view of yet another thin film transistor according to an exemplary embodiment of the present disclosure.

An interface of the first and second semiconductive elements, 154a and 154b, may have a gradual change in composition. Alternatively, in some cases, it may be desirable to have a sudden change in respective compositions between those of the first and second semiconductive elements, 154a and 154b. The gradual change from one composition to the other may be prevented by using different sputtering targets for the first and second semiconductive elements, 154a and 154b. Thus, no intermediate layer having different composition from the first semiconductive element 154a and the second semiconductive element 154b is generated in the boundary portion between the first semiconductive element 154a and the second semiconductive element 154b. Particularly, if the content of at least one additional element X included in the second semiconductive element 154b is in the range from about 1 at. % to about 30 at. %, the mixing of the component elements of the first semiconductive element 154a and the second semiconductive element 154b may be definitely prevented by using a first sputtering target for the first 154a and a second sputtering target for the first semiconductive element 154b. Meanwhile, the respective thickness of each of the first semiconductive element 154a and the second semiconductive element 154b may be in a range from about 5 Å to about 600 Å. Also, the microstructure of the respective semiconductive oxide composition respectively included in the first semiconductive element 154a and the second semiconductive element 154b may be substantially amorphous, crystalline (e.g., by post-deposit annealing), nano-sized crystalline, or a mixture of at least two of such respective microstructures if so desired. Returning to the structure shown in FIG. 1, it may be seen that a respective source electrode 173 and respective drain electrode 175 of the semiconductive oxide transistor (sos-TFT) are respectively connected to the second semiconductive element 154b. The source electrode 173 and the drain electrode 175 face each other and are spaced apart from one another at one major surface of the second semiconductive element 154b. In the exemplary embodiment shown in FIG. 1, the source electrode 173 and the drain electrode 175 are positioned on the second semiconductive element 154b and may directly contact the second semiconductive element 154b. The source electrode 173 and the drain electrode 175 may be made of an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. For example, as the molybdenum alloy, there are Mo—Nb and Mo—Ti. Alternatively or additionally, the source electrode 173 and/or the drain electrode 175 may be made of a transparent conductive material such as ITO, IZO, and AZO. The source electrode 173 and the drain electrode 175 may be respectively made of respective multilayered structures including at least two conductive layers (not shown). For example, the source electrode 173 and the drain electrode 175 may be formed of the multilayered structure such as Mo/Al/Mo, Mo/Al, Mo/Cu, CuMn/Cu, and Ti/Cu. In one embodiment (not shown), a source-drain shorting barrier layer (not shown) is disposed on the second semiconductive element 154b and interposed between the source and drain electrodes, 173 and 175, for preventing leakage of current between them. On the other hand, according to another exemplary embodiment without the additional barrier layer (as shown in FIG. 1), a diffusion of the metal components of the source electrode 173 and of the drain electrode 175 into the second semiconductive element 154b may occur. It is desirable to prevent such contamination by the metal components. Particularly, as described above, if the content of the at least one additional element X included in the second semiconductive element 154b is equal to or more than about 1 at. % and equal to or less than about 30 at. %, the diffusion of the metal components of the source electrode 173 and the drain electrode 175 (e.g., copper (Cu)) into the second semiconductive element 154b (and/or into the first semiconductive element 154a) is prevented. Accordingly, although the source electrode 173 and the drain electrode 175 are shown in FIG. 1 as being formed directly on the second semiconductive element 154b, in the case where the source and drain electrodes are formed with the single layer of copper (Cu) for example, the deterioration of the characteristics of the thin film transistor due to copper migration and contamination should be prevented by use of one or more barrier materials. The gate electrode 124, the source electrode 173, and the drain electrode 175 along with the first semiconductive element 154a and the second semiconductive element 154b form a semiconductive oxide TFT (sos-TFT) having a channel region thereof positioned in the first semiconductive element 154a and also positioned in the second semiconductive element 154b in the area between the source electrode 173 and the drain electrode 175. The first semiconductive element 154a and the second semiconductive element 154b may each have an island shape, however they may alternatively have other shapes, including, for example, the same plan view as corresponding parts of their respective source electrode 173 or drain electrode 175. A passivation layer 180 may be formed on the source electrode 173 and the drain electrode 175 of the thin film transistor and also on the exposed second semiconductive element 154b. The passivation layer 180 may be formed of an inorganic insulator such as a silicon nitride or a silicon oxide, an organic insulator, and/or a low dielectric constant other insulating material. The structure of an exemplary thin film transistor according to the present disclosure has been described, however the structures of the thin film transistors in accordance with the present disclosure are not limited thereto. The first semiconductive element 154a and the second semiconductive element 154b having the compositional attributes and characteristics described herein may be applied to other semiconductive devices of various other structures and of corresponding manufacturing methods such that the charge-carrier mobility and threshold shift characteristics of the same may be improved in accordance with the present teachings. Next, various structures for semiconductive oxide TFT's (sos-TFT's) according to further exemplary embodiments of the present disclosure will be described with reference to FIG. 4, FIG. 5, and FIG. 6. The same constituent elements as in the previous exemplary embodiment are indicated by the same reference numerals, and the corresponding descriptions are therefore omitted. FIG. 4 is a cross-sectional view of a thin film transistor according to an exemplary second embodiment where the gate electrode is disposed on top of the semiconductive elements, 154a and 154b. FIG. 5 is a cross-sectional view of a thin film transistor according to another exemplary embodiment. FIG. 6 is a cross-sectional view of a thin film transistor having a barrier between the source and drain according to another exemplary embodiment. Firstly, referring to FIG. 4, the thin film transistor shown there is substantially the same in functionality as the first exemplary embodiment shown in FIG. 1. However the gate electrode 124 is positioned on top of the semiconductive elements, 154a and 154b, the first semiconductive element 154a is disposed next below that, the second semiconductive element 154b is disposed further below that and the source electrode 173 and the drain electrode 175 are positioned under the second semiconductive element 154b. In terms of more detail with respect to FIG. 4, the source electrode 173 and the drain electrode 175 are formed and patterned directly on the substrate 110. Next the material layers of the second semiconductive element 154b and of the first semiconductive element 154a are sequentially deposited in the recited order and thereafter simultaneously patterned. Next, the gate insulating layer 140 is positioned on the layer of the first semiconductive element 154a. Next, the material of the gate electrode 124 is positioned thereon at least in an area corresponding to a separation space between the source electrode 173 and the drain electrode 175. The passivation layer 180 is positioned over the gate electrode 124. Contact holes (not shown) are formed and a data line (not shown) is connected to the source electrode 173 while a pixel electrode (not shown) is connected to the drain electrode 175. In addition, in the exemplary embodiment shown in FIG. 4, the materials, the compositions, and the content of each constituent element, particularly the characteristics of the first and second semiconductive elements, 154a and 154b, may be made the same as those of the exemplary embodiment shown in FIG. 1. Next, referring to FIG. 5, the thin film transistor according to that exemplary embodiment is substantially the same as the exemplary embodiment shown in FIG. 1, and the first and second semiconductive elements, 154a and 154b, except for the relative size of the channel portion may have substantially the same plan view shapes as the source electrode 173 and the drain electrode 175. This thin film transistor may be formed by simultaneously patterning the first and second semiconductive elements, 154a and 154b, and the source electrode 173 and the drain electrode 175, by using a common etch mask for all where the common etch mask includes a so-called, slit or translucent region. (See also FIG. 9 as described later below.)

Figure 10:
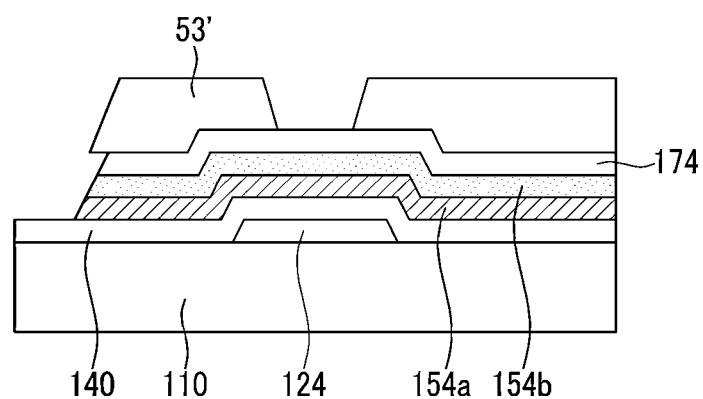
Figure 11:
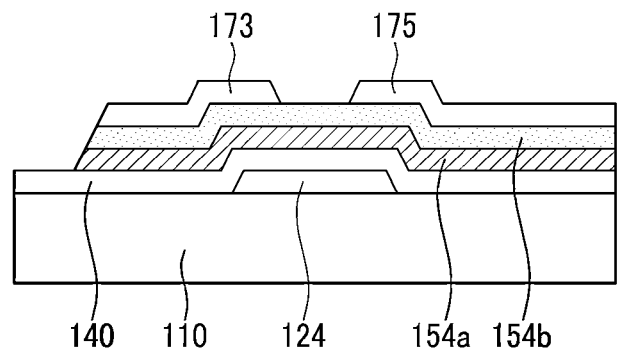
Figure 12:
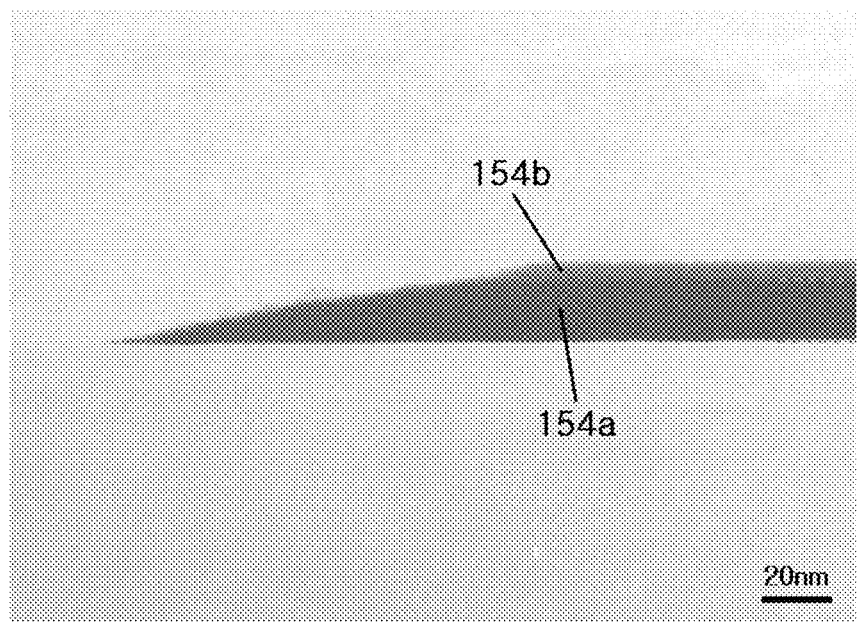
FIG. 12 is a photo showing a cross-section of a semiconductive oxide layer of a thin film transistor according to an exemplary embodiment of the present disclosure.
Figure 13:
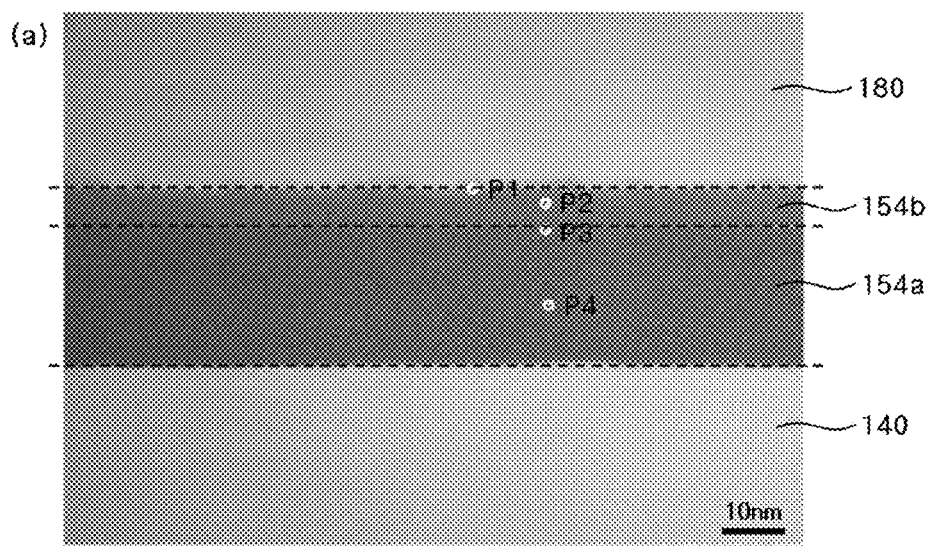
FIG. 13 is a photo (a) showing a cross-sectional of an semiconductive oxide layer of a thin film transistor according to an exemplary embodiment of the present disclosure and a table (b) showing components according to a position of an semiconductive oxide layer.
Figure 14:
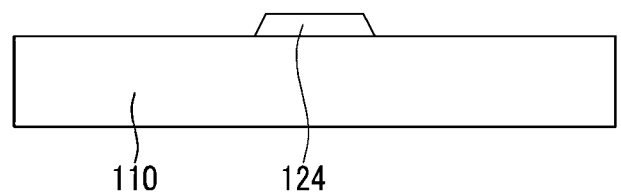
FIG. 14 to FIG. 18 are cross-sectional views sequentially showing a manufacturing method of the thin film transistor shown in FIG. 6.
Figure 15:
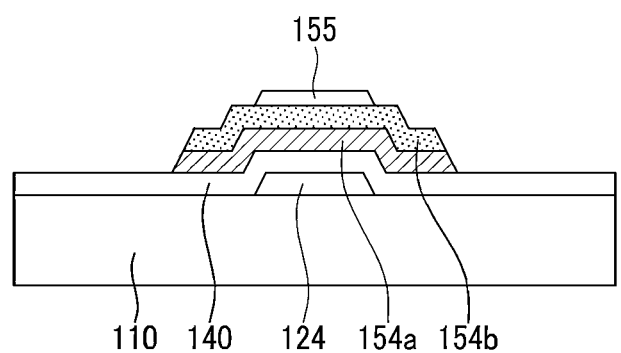
Figure 16:
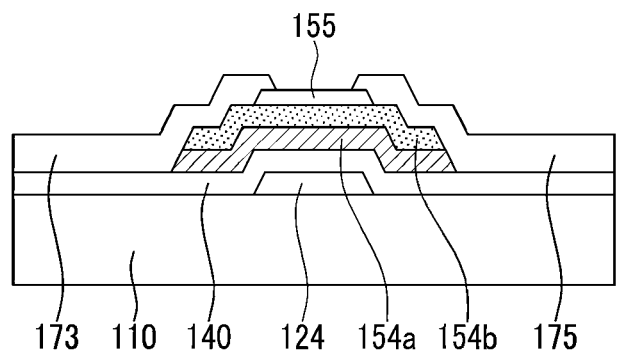
Figure 17:
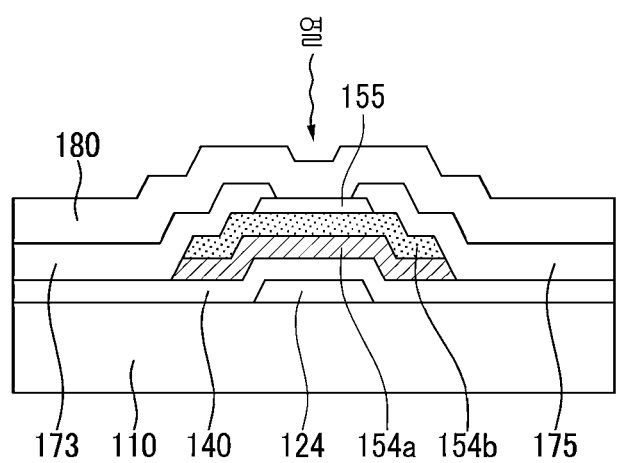
Figure 18:
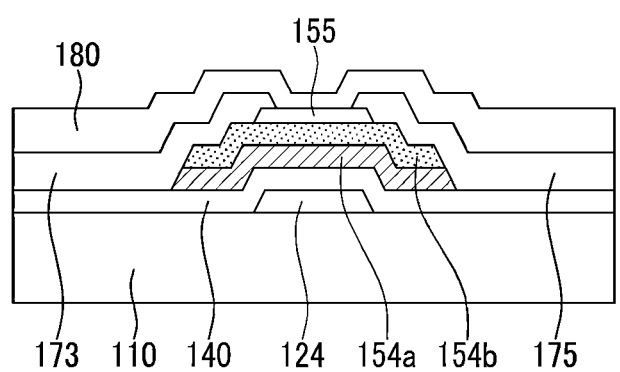
Figure 19:
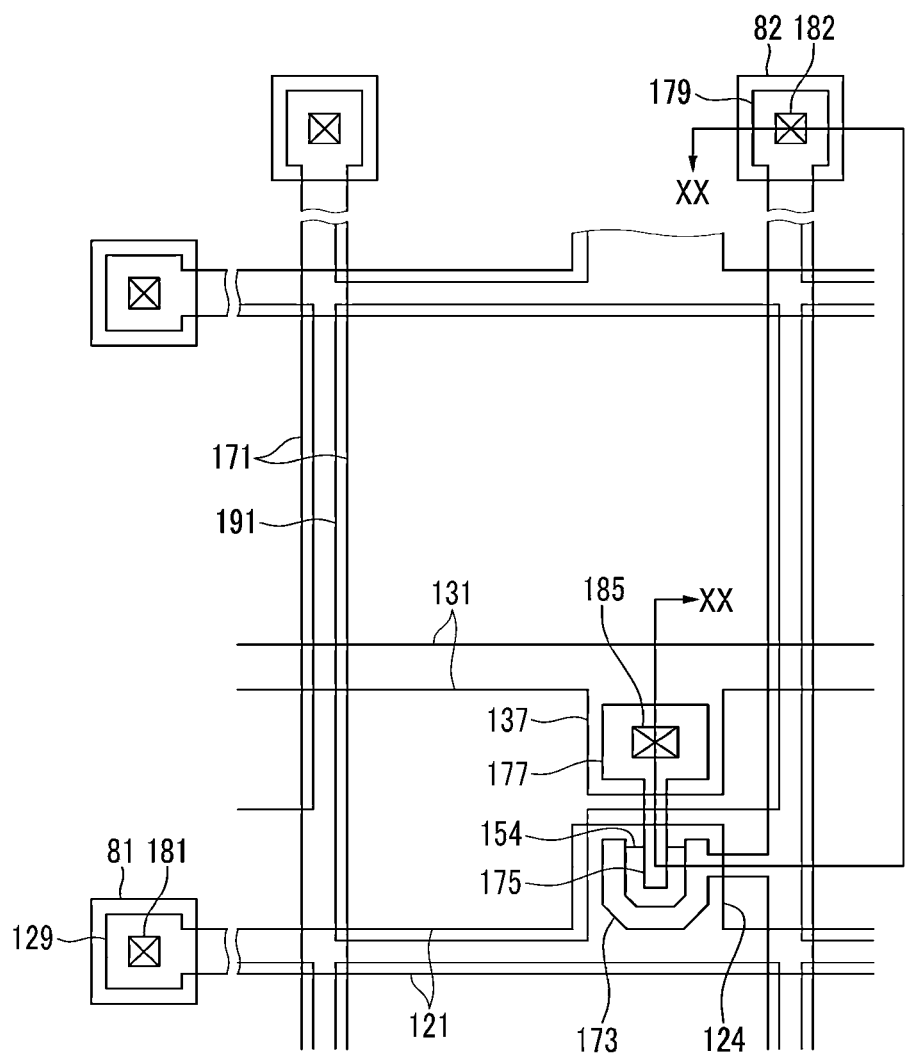
FIG. 19 is a layout view of a thin film transistor array panel of a display device including the same according to an exemplary embodiment of the present disclosure.
Figure 20:
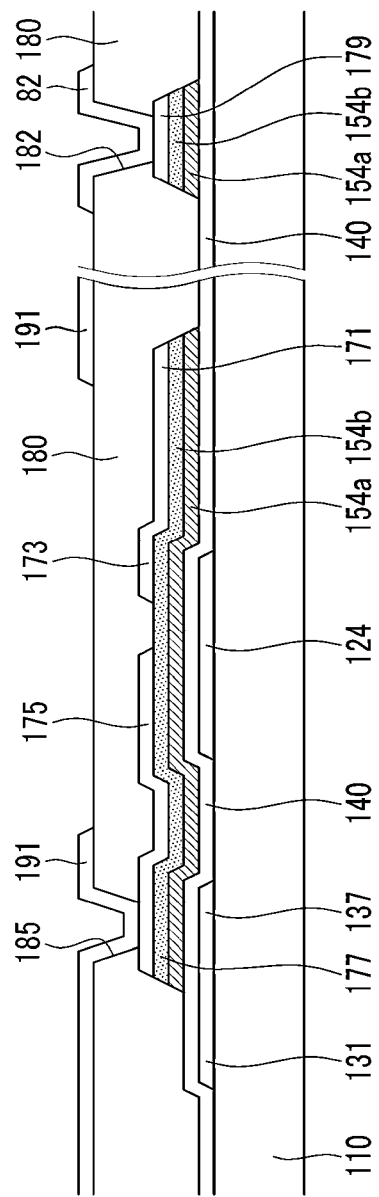
FIG. 20 is one example of a cross-sectional view of the thin film transistor array panel of FIG. 19 taken along the line XX-XX.
Figure 21:
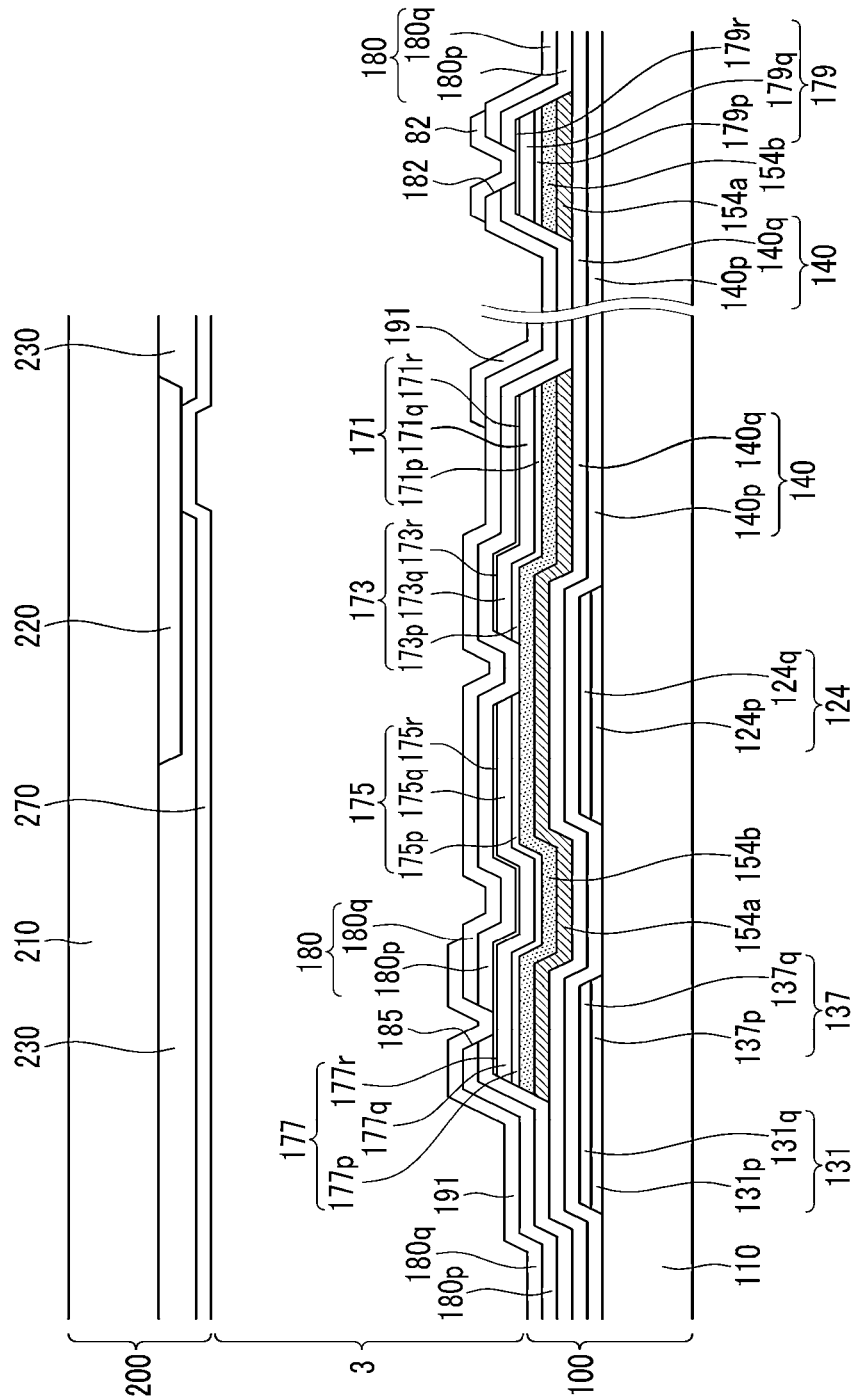
FIG. 21 is one example of a cross-sectional view of a display device including the thin film transistor array panel of FIG. 19 taken along the line XX-XX.
Figure 22:
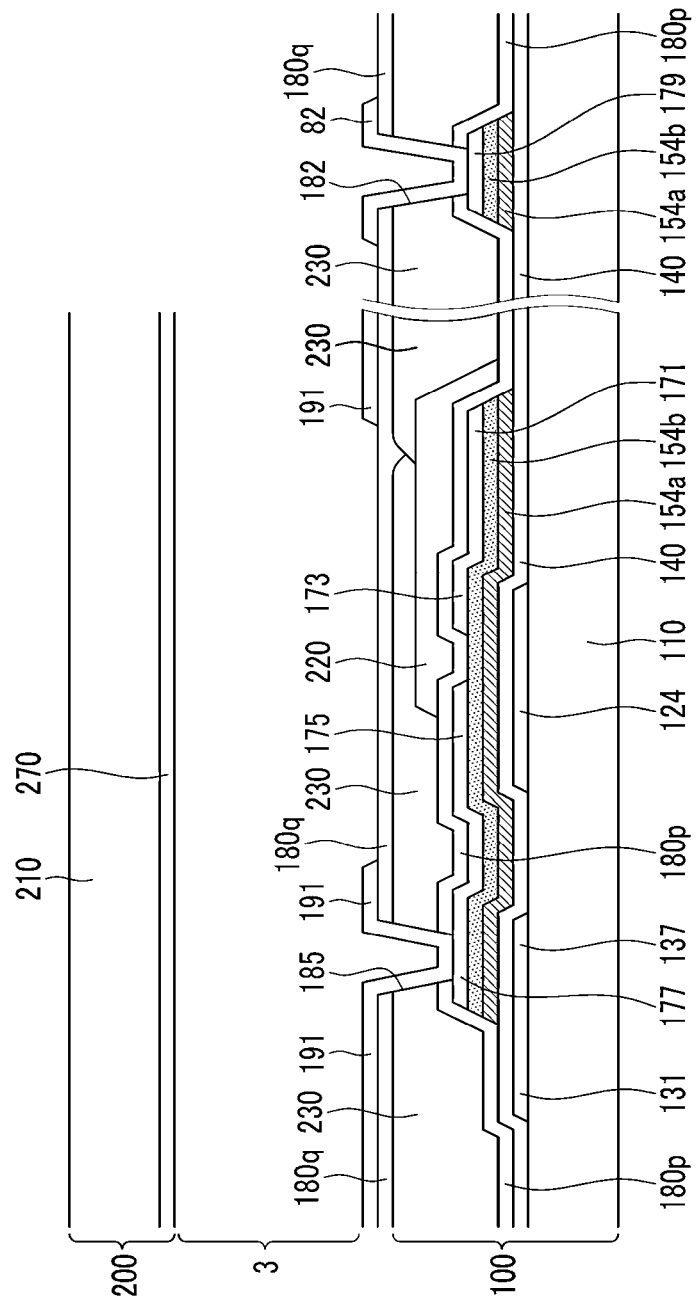
FIG. 22 is one example of a cross-sectional view of a display device including the thin film transistor array panel of FIG. 19 taken along the line XX-XX.
Figure 23:
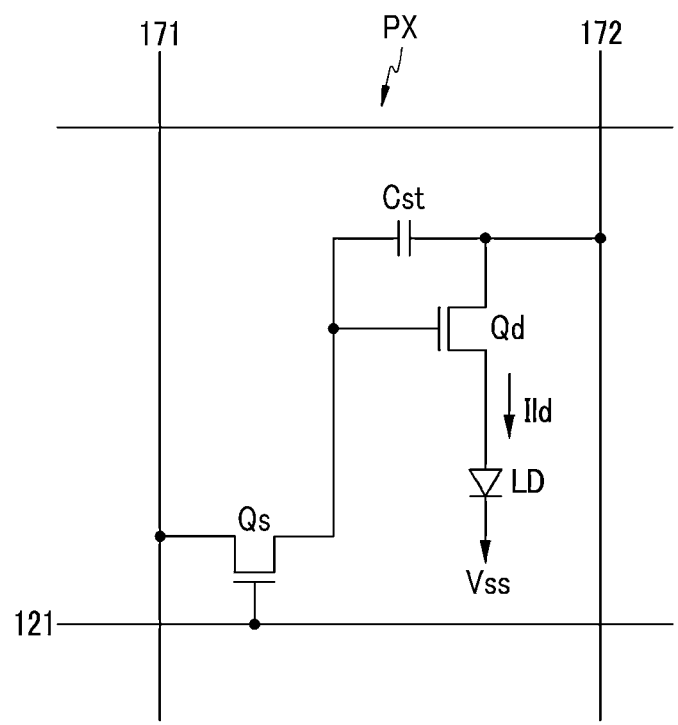
FIG. 23 is an equivalent circuit diagram of a display device according to an exemplary embodiment of the present disclosure.
Figure 24:
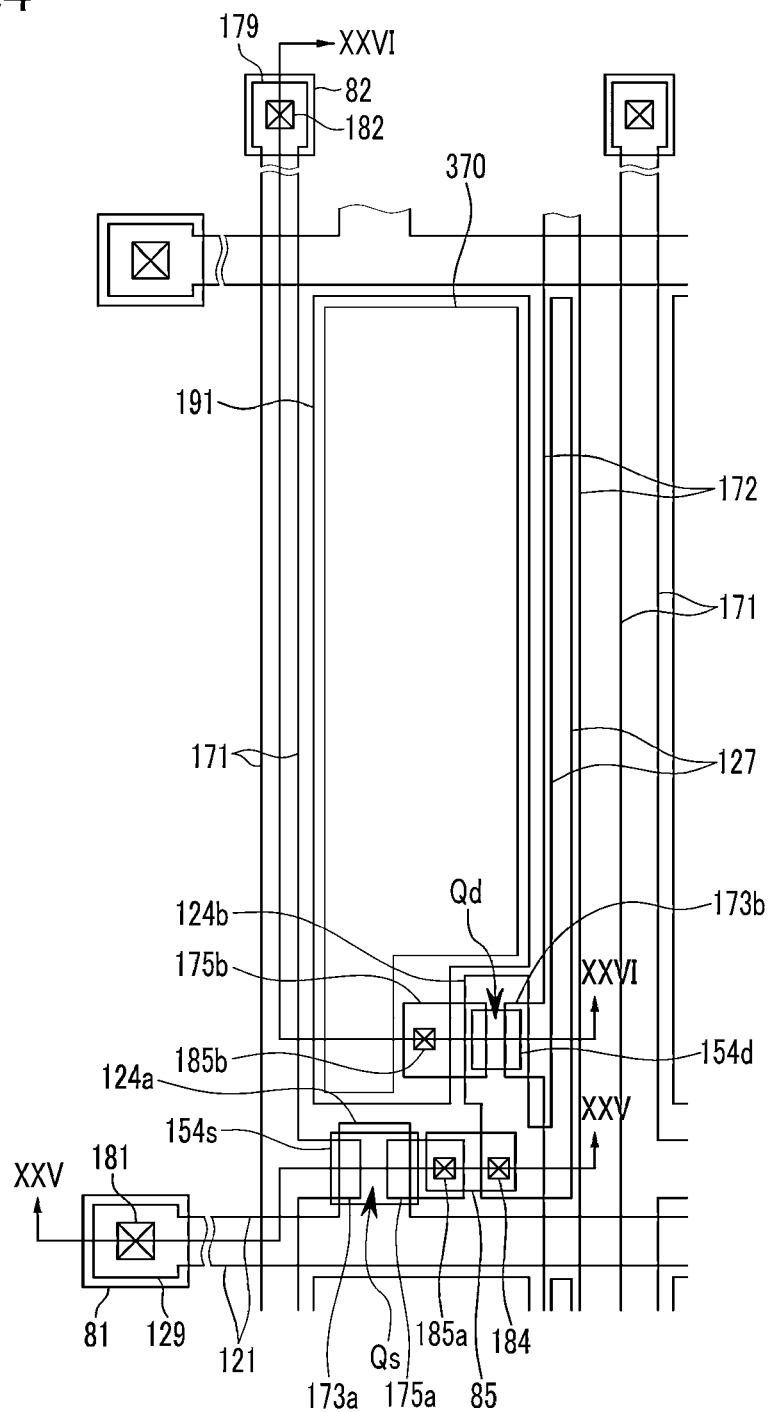
FIG. 24 is a layout view of a display device according to an exemplary embodiment of the present disclosure.
Figure 25:
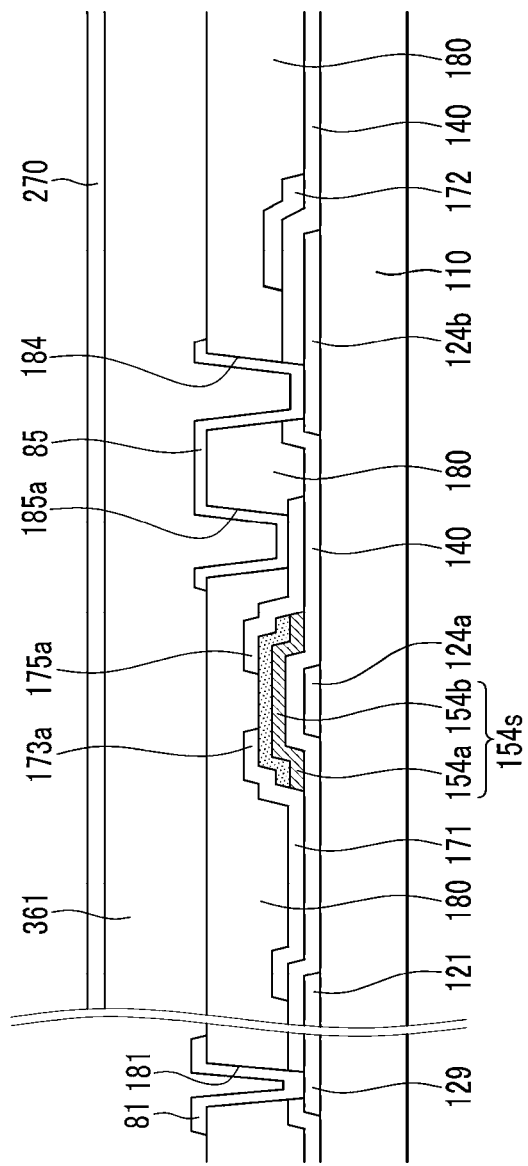
FIG. 25 is a cross-sectional view of the display device of FIG. 24 taken along the line XXV-XXV.
Figure 26:
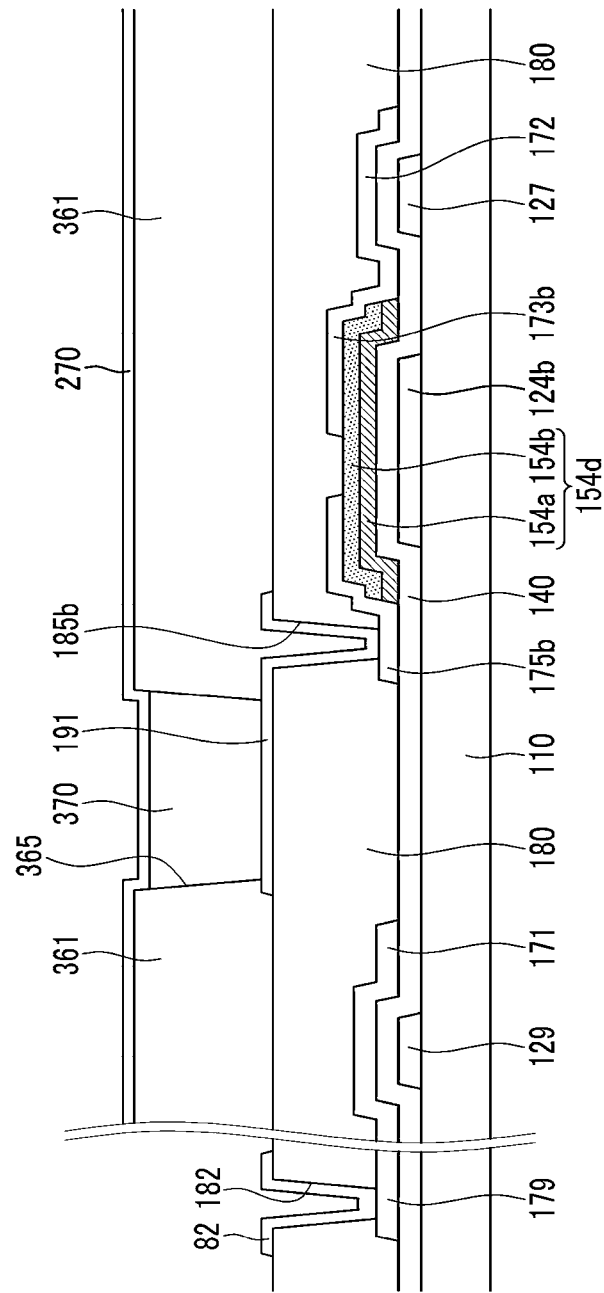
FIG. 26 is a cross-sectional view of the display device of FIG. 24 taken along the line XXVI-XXVI.

In addition, for the exemplary embodiment shown in FIG. 5, the materials, the compositions, and the content of each constituent elements, particularly the characteristics of the first and second semiconductive elements, 154a and 154b, may be made substantially the same as those of the exemplary embodiment shown in FIG. 1. Next, referring to FIG. 6, the thin film transistor according to the illustrated embodiment thereof is substantially the same as most of the exemplary embodiment shown in FIG. 1, except that an etch stopper (referred to herein also as an etching preventing layer) 155 is further positioned on the second semiconductive element 154b. The etch stopper 155 protectively covers the channel areas of the first and second semiconductive elements, 154a and 154b, such that damage to the channel region of the thin film transistor by the etchant may be prevented in following patterning processes. Also, the etch stopper 155 prevents impurities such as hydrogen from being diffused into the first and second semiconductors 154a and 154b for example from an insulating material of the passivation layer 180, thereby preventing a change of the characteristics of the first and second semiconductors 154a and 154b. The thickness of the etch stopper 155 may be equal to or less than about 3000 Å, and the etch stopper 155 may be formed of an inorganic material layer including at least one material of SiOx, SiNx, SiOCx, and SiONx, or the organic layer including the organic material or a polymer organic material. The passivation layer 180 is positioned on top of the etch stopper 155 as well as over the source electrode 173, and the drain electrode 175. In addition, for the exemplary embodiment shown in FIG. 6, the materials, the compositions, and the contents of each constituent elements, particularly the characteristics of the first and second semiconductive elements, 154a and 154b, may be made substantially the same as those of the exemplary embodiment shown in FIG. 1. Next, a manufacturing method of the thin film transistor according to the exemplary embodiment shown in FIG. 5 will be described with reference to FIG. 7, FIG. 8, FIG. 9, FIG. 10, FIG. 11, FIG. 12, and FIG. 13. FIG. 7 to FIG. 11 are cross-sectional views sequentially showing a manufacturing method of the thin film transistor shown in FIG. 5, FIG. 12 is a micrograph photo showing a cross-section of a semiconductive oxide layer of a thin film transistor according to an exemplary embodiment of the present disclosure, and FIG. 13 is a photo (a) showing a cross-section of a semiconductive oxide layer of a thin film transistor according to an exemplary embodiment of the present disclosure and a table (b) showing components according to a positions within an semiconductive oxide layer. Firstly, referring to FIG. 7, the material layer of the gate electrode 124 is deposited and patterned so as to position the gate electrode at a predetermined location on the substrate 110, where the latter includes an insulating material such as plastic or glass. Next, referring to FIG. 8, a gate insulating layer 140 is provided as made of an insulating material such as a silicon oxide (SiOx), a silicon nitride (SiNx), or a silicon oxynitride (SiOxNy) where the insulating layer 140 is formed on the patterned gate electrode 124. Next, a first semiconductive oxide layer 150a, a second semiconductive oxide layer 150b, and a source and drain forming conductive layer 170 are sequentially deposited thereon in the illustrated order. The first semiconductive oxide layer 150a may be formed by a sputtering method using a corresponding, first semiconductive oxide target whose composition includes the desired oxides including for example indium (In), tin (Sn), and zinc (Zn). The second semiconductive oxide layer 150b may be similarly formed by the sputtering method using a corresponding second semiconductive oxide target whose composition includes the additional element X where the latter includes at least one of gallium (Ga), silicon (Si), niobium (Nb), hafnium (Hf), and germanium (Ge), and optionally further including indium (In) or not. The content of the at least one additional element X included in the second semiconductive oxide layer 150b may be in the range from about 1 at. % to about 30 at. %. The conductive layer 170 may be formed by a corresponding sputtering method using a third target made of the desired metals, such as for example, copper (Cu). Next, referring to FIG. 9, a photosensitive film 50 is formed on the conductive layer 170 and patterned to thereby define a patterned etch stop. More specifically, the patterned photosensitive film 50 (a.k.a. photoresist or PR) includes a first portion 51 having a relatively thin thickness and a second portion 53 having a relatively thicker thickness. The first portion 51 aligns with the location of the gate electrode 124. The first semiconductive oxide layer 150a, the second semiconductive oxide layer 150b, and the conductive layer 170 are simultaneously etched according to a predetermined pattern by using the photosensitive film 50 as an etching mask to thereby form the first semiconductive element 154a, the second semiconductive element 154b, and a partially patterned conductor layer 174 as shown in FIG. 10. At this time, a wet-etching process may be used, and the etchant used may be an etchant that is capable of selectively etching the conductive layer 170, the first semiconductive oxide layer 150a, and the second semiconductive oxide layer 150b together. The difference between the etch rates of the first semiconductive element 154a and the second semiconductive element 154b for the etchant should be equal to or less than about 100 Å/s such that an undercut or misalignment generated between edges of the first semiconductive element 154a and those of the second semiconductive element 154b may be prevented. In FIGS. 10-11, the spacing between the source and drain electrodes is formed in a position overlying the gate electrode 124. Referring to FIG. 12, it may be confirmed by way of a micrograph that too much of an undercut or misalignment (e.g., more than about 100 nm) is not generated between the edges of the first semiconductive oxide layer 150a and the second semiconductive oxide layer 150b formed according to an exemplary embodiment of the present disclosure. Next, referring in more detail to FIG. 10, the photosensitive film 50 is partially removed by an ashing or partially dry-etched to remove an upper thickness part including the first portion 51 having the thin thickness. At this time, the thickness of the second portion 53 is decreased by a thickness of the removed first portion 51 thereby forming a modified photosensitive film 53' as shown. Next, referring in more detail to FIG. 11, by using the modified photosensitive film 53' as the etching mask, the conductor layer 174 is patterned to form the source electrode 173 and the spaced apart drain electrode 175. At this time, in order to not etch the first and second semiconductive oxide layers 154a and 154b, the etch rate of the etchant for the conductor layer 174 is selected so as to be selective against etching the first and second semiconductive oxide layers 154a and 154b. Next, the photosensitive film 53' is removed, and as shown in FIG. 5, the passivation layer 180 of the insulating material is formed. After coating the insulating material for the passivation layer 180, to improve the characteristics of the thin film transistor, a heat treatment may be performed at a high temperature or annealing may be performed. The heat treatment may be applied with various methods such as a dry type, a wet type, a furnace type, and rapid thermal annealing (RTA). The applied heat or annealing treatment may cause crystallization within one or both of the first and second semiconductive elements, 154a and 154b. Referring to the cross-sectional micrograph of FIG. 13 as shown in portion (a) of FIG. 13, although the heat treatment is performed after forming the passivation layer 180, the components of the first semiconductive element 154a and the second semiconductive element 154b formed by the manufacturing method are essentially not mixed with each other and the first semiconductive element 154a and the second semiconductive element 154b remain substantially separated from each other. The compositional analysis shown in portion (b) of FIG. 13 is for an example including gallium (Ga) as the additional element X of the second semiconductive element 154b, and it also includes a small amount of indium (In). The components of the first position P1 and the second position P2 corresponding to the second semiconductive element 154b are almost equally maintained, and the components of the third position P3 and the fourth position P4, where the latter are disposed within a depth corresponding to the first semiconductive element 154a are also equally maintained such that it may be confirmed that little movement (change) of the compositional elements has occurred between the components of the first semiconductive element 154a and those of the second semiconductive element 154b. More specifically, despite an annealing step, there is no discernible mixing of the components of the first semiconductive element 154a with those of the second semiconductive element 154b or the formation of an interposed third layer at the boundary (dashed line above P3) between the first semiconductive element 154a and the second semiconductive element 154b even though the heat treatment was applied in the manufacturing process of the corresponding thin film transistor. Next, the method of manufacturing the thin film transistor according to the exemplary embodiment of FIG. 6 will be described with reference to FIG. 14, FIG. 15, FIG. 16, FIG. 17, and FIG. 18. The same constituent elements as in the previous exemplary embodiment are indicated by the same reference numerals, and the same description will therefore be omitted. FIG. 14 to FIG. 18 are cross-sectional views sequentially showing a manufacturing method for the thin film transistor shown in FIG. 6. Firstly, referring to FIG. 14, the gate electrode 124 is formed so as to be positioned on a substrate 110 including a light-passing insulating material such as plastic or glass. Next, referring to FIG. 15, the gate insulating layer 140 made of the insulating material such as a silicon oxide (SiOx), a silicon nitride (SiNx), or a silicon oxynitride (SiOxNy) is formed on the gate electrode 124. Thereafter, the respective layers of the first semiconductive element 154a and of the second semiconductive element 154b are sequentially formed on top of the gate insulating layer 140. The first semiconductive oxide layer (not shown) and the second semiconductive oxide layer (not shown) may be sequentially deposited by sputtering and using a corresponding set of semiconductive oxide targets. The first semiconductive oxide layer may be deposited using a target including oxides formed from indium (In), tin (Sn), and zinc (Zn). The second semiconductive oxide layer may be deposited using a target including the same oxides of the first semiconductive oxide layer and an oxide formed from the additional element X. The additional element may include gallium, silicon, niobium, hafnium, or germanium. The second semiconductive oxide layer may not include an oxide formed from indium (In). A wet-etching using an etchant may be used to form patterned first semiconductive element and second semiconductive element. The difference between the etch rates of the first semiconductive element 154a and the second semiconductive element 154b may be equal to or less than about 100 Å/s, and more in detail, it may be equal to or less than about 10 Å/s. The content of at least one additional element X included in the second semiconductive element 154b may be in the range from about 1 at. % to about 30 at. %. After patterning the first semiconductive element 154a and the second semiconductive element 154b, a heat treatment (a crystallizing anneal) is performed for the entire substrate 110 thereby improving the characteristics of the being-formed thin film transistor. The heat treatment method may be various methods such as the dry type, the wet type, the furnace type, and the rapid thermal annealing (RTA). As described, the components of the first semiconductive element 154a and the second semiconductive element 154b according to the present disclosure are not mixed with each other even after the heat treatment and no interfacial layer is formed in the boundary between the first semiconductive element 154a and the second semiconductive element 154b such that the characteristics of the thin film transistor are not negatively affected by the crystallizing anneal step and the charge-carrier mobility characteristics of the semiconductive oxide TFT (sos-TFT) may be improved by the crystallizing anneal step. Next, the etch stopper 155 may be additionally formed on the second semiconductive element 154b. The etch stopper 155 may be formed on the second semiconductive element 154b by depositing and thereafter patterning an insulating layer. The insulating layer may be formed on the second semiconductive element 154b, for example, by chemical vapor deposition (CVD) or sputtering. At this time, a dry-etch method may be used, and an etching gas having a selective etch rate so as not to etch the first semiconductive element 154a and the second semiconductive element 154b may be used. After patterning the etch stopper 155, a second heat treatment is performed for the entire substrate 110 to further improve the characteristics of the thin film transistor. The heat treatment method may be various methods such as the dry type, the wet type, the furnace type, and the rapid thermal annealing (RTA). In this case, the composition components of the first semiconductive element 154a and the second semiconductive element 154b are not mixed with each other and a no interfacial layer is formed in the boundary between the first semiconductive element 154a and the second semiconductive element 154b such that the characteristics of the thin film transistor are not negatively affected by the second crystallizing anneal step and the charge-carrier mobility characteristics of the semiconductive oxide TFT (sos-TFT) may be improved by the second crystallizing anneal step. Next, referring to FIG. 16, the source and drain metal such as for example one including copper (Cu) is deposited and patterned on the gate insulating layer 140, the second semiconductive element 154b, and the etch stopper 155 to thereby form the source electrode 173 and the drain electrode 175. At this time, a wet-etching may be used, and an etchant having a selective etch rate so as not to etch the first semiconductive element 154a and the second semiconductive element 154b may be used. Next, referring to FIG. 17 and FIG. 18, an inorganic insulator such as a silicon nitride or a silicon oxide, or an organic insulator, or a low dielectric constant insulating insulator is deposited on the source electrode 173 and the drain electrode 175 to form the passivation layer 180. As described above, after coating the insulating material for the passivation layer 180, a further heat treatment or annealing step may be performed at a high temperature to further improve the characteristics of the thin film transistor. The heat treatment method may be various methods such as the dry type, the wet type, the furnace type, and the rapid thermal annealing (RTA). Next, a structure of a thin film transistor array panel that includes plural ones of the semiconductive oxide TFT's (sos-TFT's) according to the present disclosure will be described with reference to FIG. 19 and FIG. 20. The same constituent elements as in the previous exemplary embodiment are indicated by the same reference numerals, and a repeated description is therefore omitted. FIG. 19 is a top plan layout view of a thin film transistor array panel and a display device including the same according to an exemplary embodiment of the present disclosure. FIG. 20 is one cross sectional example of the thin film transistor array panel of FIG. 19 taken along the line XX-XX. In the present exemplary embodiment, the thin film transistor array panel is of the liquid crystal display (LCD) type. However the thin film transistor array panel according to other exemplary embodiments may be applied to several other kinds of flat panel displays such as organic light emitting devices (OLED displays), electrophoretic displays, etc. In FIG. 19, a gate line 121 and a storage electrode line 131 are positioned on the insulating substrate 110 made of glass or plastic. The gate line 121 may transmit gate signals and may extend in an approximate row direction, and may include a plurality of gate electrodes 124 integrally branching out therefrom. Also, the gate line 121 includes a terminal end 129. However, the end 129 of the gate line may be omitted. A storage electrode line 131 configured for receiving a predetermined voltage extends substantially parallel to the gate line 121 and includes a storage electrode 137 integrally branching out therefrom. The shape and arrangement of the storage electrode line 131 and the storage electrode 137 may be various. The storage electrode line 131 may be omitted. The gate line 121 and the storage electrode line 131 may be made of appropriate conductive materials such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). Also, the gate line 121 and the storage electrode line 131 may be made of or include a transparent conductive material such as ITO, IZO, and AZO. The gate line 121 and the storage electrode line 131 may be made of a multilayered structure including at least two conductive layers (not shown). A gate insulating layer 140 is positioned on the gate line 121 and on the storage electrode line 131. The gate insulating layer 140 may include a silicon nitride, a silicon oxide, a SiON composition, or an organic insulating material. The gate insulating layer 140 may have a multilayered structure including at least two insulating layers (not shown). For example, an upper layer of the gate insulating layer 140 may include SiOx and a lower layer may include SiNx, or the upper layer may include SiOx and the lower layer may include SiOxNy. The first semiconductive element 154a and the second semiconductive element 154b including the respective semiconductive oxides are formed on the gate insulating layer 140. The constitutions and the characteristics of the first semiconductive element 154a and the second semiconductive element 154b may be the same as those of the several exemplary embodiments described above and as such the detailed description is omitted. A data line 171 and a drain electrode 175 are formed on the second semiconductive element 154b. The data line 171 is configured for transmitting the data voltages of the display and it extends in the approximate column direction and intersects the gate line 121. The data line 171 includes a terminal end 179, and may include a source electrode 173 curved with a "U" shape on the gate electrode 124. In addition, the shape of the source electrode 173 may be changed. The drain electrode 175 is separated from the data line 171 and may include an end of a bar type enclosed by the source electrode 173 and an expansion portion 177 as the other end. The expansion portion 177 may overlap the storage electrode 137. As seen in FIG. 20, the expansion portion 177 may be used as a contact area for electrical connection to the pixel-electrode 191. The data line 171 and the drain electrode (175 and 177) may be made of an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. For example, as the molybdenum alloy, there are Mo—Nb and Mo—Ti. Also, the source electrode 173 and the drain electrode 175 may include a transparent conductive material such as ITO, IZO, and AZO. The source electrode 173 and the drain electrode 175 may be made of a multilayered structure including at least two conductive layers (not shown). The gate electrode 124, the source electrode 173, and the drain electrode 175 form the thin film transistor along with the first semiconductive element 154a and the second semiconductive element 154b, and the channel of the thin film transistor is positioned in the first semiconductive element 154a and the second semiconductive element 154b between the source electrode 173 and the drain electrode 175. The first semiconductive element 154a and the second semiconductive element 154b except for the channel may have substantially the same plan view shape as the portions of the data line 171 and the drain electrode 175 overlapping them. The forming method of the first semiconductive element 154a and the second semiconductive element 154b, and the data line 171 and the drain electrode 175, may depend on the manufacturing method shown in FIG. 7 to FIG. 13. A passivation layer 180 made of an inorganic and/or organic insulating material is formed on the data line 171 and the drain electrode 175. The passivation layer 180 may be formed with multiple layers. For example, a lower layer of the passivation layer 180 may include a SiOx composition and an upper layer may include a SiNx composition, or the lower layer may include SiOx and the upper layer may include SiOxNy. The passivation layer 180 has a contact hole 185 exposing the expansion part (over 177) of the drain electrode 175 and a contact hole 182 exposing the end 179 of the data line. Also, the passivation layer 180 and the gate insulating layer 140 have a contact hole 181 exposing the end 129 of the gate line 121. A pixel electrode 191 and contact assistants 81 and 82 are formed so as to be positioned on the passivation layer 180. The pixel electrode 191 and the contact assistants 81 and 82 may be made of a transparent conductive material such as ITO or IZO. The pixel electrode 191 is electrically connected to the drain electrode 175 through the contact hole 185 thereby receiving the data voltage. The contact assistant 81 is positioned on the end 129 of the gate line and is connected to the end 129 of the gate line through the contact hole 181. The contact assistant 82 is positioned on the end 179 of the data line and is connected to the end 179 of the data line through the contact hole 182. Next, a display device including semiconductive oxide TFT's (sos-TFT's) according to an exemplary embodiment of the present disclosure will be described with reference to FIG. 19 and FIG. 21. The same constituent elements as in the previous exemplary embodiment are indicated by the same reference numerals, and the same description is therefore omitted. FIG. 21 is one example of other possible cross-sectional view of a display device including the thin film transistor array panel of FIG. 19 taken along the line XX-XX. The display device according to the present exemplary embodiment of FIG. 21 includes a lower panel 100 and an upper panel 200 facing each other, and a liquid crystal layer 3 interposed therebetween. The lower panel 100 includes the thin film transistor array which is substantially the same as most of the exemplary embodiment shown in FIG. 20. However in the present exemplary embodiment, at least one of the gate line 121, the storage electrode line 131, the gate insulating layer 140, the passivation layer 180, the data line 171, and the drain electrode 175 may include multiple conductive material layers. In detail, the gate electrode 124 may include a lower gate electrode 124p and an upper gate electrode 124q, and the storage electrode line 131 may include a lower storage electrode line 131p and an upper storage electrode line 131q. For example, the lower gate electrode 124p and the lower storage electrode line 131p may include titanium (Ti), and the upper gate electrode 124q and the upper storage electrode line 131q may include copper (Cu). The gate insulating layer 140 may include a lower gate insulating layer 140p and an upper gate insulating layer 140q. For example, the lower gate insulating layer 140p may include a silicon nitride (SiNx), the upper gate insulating layer 140q may include a silicon oxide (SiOx), and they may be exchanged. The first semiconductive element 154a and the second semiconductive element 154b positioned on the gate insulating layer 140 are the same as the first semiconductive element 154a and the second semiconductive element 154b included in the thin film transistor according to the above several exemplary embodiments such that the detailed description thereof is omitted. The data line 171 and the drain electrode 175 may include triple layers. The data line 171 may include lower data lines 171p, 173p, and 179p, middle data lines 171q, 173q, and 179q, and upper data lines 171r, 173r, and 179r, and the drain electrode 175 may include lower drain electrodes 175p and 177p, middle drain electrodes 175q and 177q, and upper drain electrodes 175r and 177r. For example, the triple layers may include molybdenum (Mo), aluminum (Al), and molybdenum (Mo) that are sequentially positioned, for example in the recited order. Differently, the data line 171 and the drain electrode 175 may be formed with a dual layer of Ti/Cu or CuMn/Cu. The passivation layer 180 may also be formed of a dual layer of a lower passivation layer 180p and an upper passivation layer 180q. Referring to the upper panel 200, a light blocking member 220 and a color filter 230 are formed on an insulation substrate 210. The light blocking member 220 is referred to as a black matrix, and may be used to prevent light leakage between pixels. The color filter 230 may have a belt shape between adjacent data lines 171. The color filter 230 may include pigments for producing corresponding red, green, or blue emitted lights, and a photosensitive organic material. An opposing electrode 270 is formed on the light blocking member 220 and the color filter 230. The opposing electrode 270 may include a transparent conductive oxide such as ITO and IZO. The liquid crystal layer 3 may have positive or negative dielectric anisotropy, and liquid crystal molecules of the liquid crystal layer 3 are aligned such that the long axes thereof may be arranged parallel or perpendicular to the surface of the lower and upper display panels 100 and 200 when an electric field is not applied. When the pixel electrode 191 is supplied with an appropriate data voltage from the drain electrode 175, it generates an electric field through the liquid crystal layer 3 and to the opposing electrode 270 of the upper panel 200, thereby determining the orientation direction of the liquid crystal molecules of the liquid crystal layer 3 between the pixel electrode 191 and the opposing electrode 270. Accordingly, with the aid of polarizing layers, the luminance of the light transmitted through the liquid crystal layer 3 may be caused to differ depending on the thusly determined orientation of the liquid crystal molecules. The pixel electrode 191 and the opposing electrode 270 form a liquid crystal capacitor such that the applied voltage is maintained (e.g., over a frame period) even after the thin film transistor is turned off. The pixel electrode 191 and the drain electrode 175 connected thereto overlap the storage electrode 137 and the storage electrode line 131, thereby forming the storage capacitor. Next, another display device including the thin film transistor according to an exemplary embodiment of the present disclosure will described with reference to FIG. 19 and FIG. 22. The same constituent elements as in the previous exemplary embodiment are indicated by the same reference numerals, and the same description is omitted. FIG. 22 is one example of a cross-sectional view of a display device including the thin film transistor array panel of FIG. 19 taken along the line XX-XX, The display device according to the present exemplary embodiment includes the lower panel 100 and the upper panel 200, and the liquid crystal layer 3 interposed therebetween. The lower panel 100 according to the present exemplary embodiment as the thin film transistor panel is the same as most of the exemplary embodiment shown in FIG. 20, however the light blocking member 220 and the color filter 230 are further included. Also, the passivation layer 180 includes the lower passivation layer 180p and the upper passivation layer 180q. The light blocking member 220 and the color filter 230 may be positioned between the lower passivation layer 180p and the upper passivation layer 180q. Referring to the upper panel 200, the opposing electrode 270 is positioned on the substrate 210. Differently from FIG. 22, in an alternate embodiment, one of the light blocking member 220 and the color filter 230 may be positioned in the upper panel 200, and the other may be positioned in the lower panel 100. Next, yet another display device including the semiconductive oxide TFT's (sos-TFT's) according to the present disclosure will be described with reference to FIG. 23, FIG. 24, FIG. 25, and FIG. 26. The same constituent elements as in the previous exemplary embodiment are indicated by the same reference numerals, and the same description is omitted. FIG. 23 is an equivalent circuit diagram of a OLED type display device according to an exemplary embodiment of the present disclosure, FIG. 24 is a layout view of a display device according to an exemplary embodiment of the present disclosure, FIG. 25 is a cross-sectional view of the display device of FIG. 24 taken along the line XXV-XXV, and FIG. 26 is a cross-sectional view of the display device of FIG. 24 taken along the line XXVI-XXVI. In the present exemplary embodiment, an organic light emitting device (OLED) is provided as an example, however the thin film transistor according to an exemplary embodiment of the present disclosure may be applied to various other flat panel displays. Firstly, referring to FIG. 23, an organic light emitting device according to the present exemplary embodiment includes a plurality of signal lines 121, 171, and 172, and a plurality of pixels PX connected thereto and arranged substantially in a matrix. The signal lines include a plurality of gate lines 121 for transmitting gate signals (or scanning signals), a plurality of data lines 171 for transmitting data signals, and a plurality of driving voltage lines 172 for transmitting a driving voltage for powering turned-on ones of the light emitters (LD). Each pixel PX includes a switching transistor Qs, a driving transistor Qd, a storage capacitor Cst, and an organic light emitting element LD. The switching transistor Qs includes a control terminal (gate), an input terminal (source), and an output terminal (drain), in which the control terminal is connected to the gate line 121, the input terminal is connected to the data line 171, and the output terminal is connected to the driving transistor Qd. The switching transistor Qs transmits a data signal received from the data line 171 to the driving transistor Qd in response to the scanning signal received from the gate line 121. The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd applies an output current ILD whose magnitude varies according to the voltage applied between the control terminal and the output terminal (which voltage may be stored by storage capacitor Cst). The capacitor Cst is connected between the control terminal and the input terminal of the driving transistor Qd. The capacitor Cst stores the data signal applied to the control terminal of the driving transistor Qd, and maintains the stored data signal even after the switching transistor Qs is turned off. The organic light emitting element LD is an organic light emitting diode (OLED), for example having an anode connected to the output terminal of the driving transistor Qd and a cathode connected to a common voltage Vss. The organic light emitting element LD emits a light whose intensity is varied according to the output current ILD of the driving transistor Qd, to thereby display an image. The organic light emitting element LD may include an organic material uniquely configured for emitting at least one of primary colors such as three primary colors of red, green, and blue, or a white color, and the organic light emitting device emits desired images by a spatial sum of the lights output by the pixels thereof. Next, the detailed structure of the organic light emitting device shown in FIG. 23 will be described with reference to FIG. 24, FIG. 25, and FIG. 26. A plurality of gate conductors including a plurality of gate lines 121 including a first control electrode 124a and a plurality of second control electrodes 124b including a storage electrode 127 are formed on an insulation substrate 110 made of a material such as transparent glass or plastic. Each of the gate lines 121 includes a wide end 129 for connecting to another layer or an external driving circuit, and the first control electrode 124a upwardly extends from the gate line 121. The second control electrode 124b is separated from the gate line 121 and includes a storage electrode 127 extending in the longitudinal direction. A gate insulating layer 140 is formed on the gate conductor. A plurality of switching semiconductive oxide regions 154s and a plurality of driving semiconductive oxide regions 154d are formed on the gate insulating layer 140. Each respective switching semiconductive oxide region 154s overlaps the first control electrode 124a, and each respective driving semiconductive oxide region 154d overlaps the second control electrode 124b. The switching semiconductive oxide regions 154s and the driving semiconductive oxide regions 154d respectively each include a corresponding first semiconductive element 154a and the second semiconductive element 154b including the semiconductive oxides, like those of the above-described several exemplary embodiments. The constitutions and the characteristics of the first semiconductive element 154a and the second semiconductive element 154b are substantially the same as those of the several exemplary embodiments such that the detailed description is omitted here. A plurality of data conductors including a plurality of data lines 171, a plurality of driving voltage lines 172, and a plurality of first and second output electrodes 175a and 175b are formed on the switching semiconductive oxide regions 154s and the driving semiconductive oxide regions 154d. Each data line 171 includes a plurality of first input electrodes 173a extending toward the first control electrode 124a and an end 179 having a wide area for connecting to another layer or an external driving circuit. The driving voltage line 172 includes a plurality of second input electrodes 173b extending toward the second control electrode 124b, and may include a portion overlapping the storage electrode 127. The first and second output electrodes 175a and 175b have island type shapes that are separated from each other, and may also be separated from the data line 171 and the driving voltage line 172. The first input electrode 173a and the first output electrode 175a face each other on the switching semiconductive oxide regions 154s, and the second input electrode 173b and the second output electrode 175b also face each other on the driving semiconductive oxide regions 154d. The first control electrode 124a, the first input electrode 173a, and the first output electrode 175a form the switching transistor Qs along with the switching semiconductive oxide region 154s, and the channel of the switching transistor Qs is formed in the switching semiconductive oxide region 154s between the first input electrode 173a and the first output electrode 175a. The second control electrode 124b, the second input electrode 173b, and the second output electrode 175b form the driving transistor Qd along with the driving semiconductive oxide region 154d, and the channel of the driving transistor Qd is formed in the driving semiconductive oxide region 154d between the second input electrode 173b and the second output electrode 175b. A passivation layer 180 made of an inorganic insulator such as a silicon nitride or a silicon oxide is formed on the gate insulating layer 140, the data conductor, and the exposed semiconductors 154s and 154d. The passivation layer 180 includes a contact hole 182 exposing the end 179 of the data line 171, a contact hole 185a exposing the first output electrode 175a, and a contact hole 185b exposing the second output electrode 175b. The passivation layer 180 and the gate insulating layer 140 have a contact hole 184 exposing the second control electrode 124b and a contact hole 181 exposing the end 129 of the gate line 121. A plurality of pixel electrodes 191, a plurality of connecting members 85 and a plurality of contact assistants 81 and 82 made of the conductive metal oxide such as ITO or IZO are formed on the passivation layer 180. Each pixel electrode 191 is physically and electrically connected to the second output electrode 175b through the respective contact hole 185b. The connecting member 85 connects the first output electrode 175a and the second control electrode 124b through the contact holes 185a and 184. The contact assistants 81 and 82 are respectively connected to the end 129 of the gate line 121 and the end 179 of the data line through the contact holes 181 and 182. The contact assistants 81 and 82 compensate adhesion between the ends 179 and 129 of the data line 171 and the gate line 121 and protect them. A partition 361 is formed on the passivation layer 180. The partition 361 surrounds the edges of the pixel electrodes 191 like a river bank, thereby defining a plurality of openings 365, and is made of an organic insulator or an inorganic insulator. The partition 361 may be made of a photoresist including a black pigment. A plurality of organic light emitting members 370 are formed in the openings 365 that are formed on the pixel electrodes 191 defined by the partitions 361. Each organic light emitting member 370 is made of an organic material that emits a respective light of one of three primary colors (i.e., red, green, and blue), and may alternatively emit a white light. An opposing electrode 270 is formed on the organic light emitting member 370. The opposing electrode 270 receives a common voltage Vss and may be made of a reflective metal such as calcium (Ca), barium (Ba), magnesium (Mg), silver (Ag), aluminum (Al), their alloys, etc., or a transparent conductive material such as ITO or IZO, etc.

Next, a thin film transistor according to an exemplary embodiment of the inventive concept will be described with reference to FIG. 27 to FIG. 32 as well as the previously described drawings.

The thin film transistor according to the present exemplary embodiment is the same as most of the previously described exemplary embodiment, for example, the thin film transistor according to the exemplary embodiment shown in FIG. 1, except for a first semiconductor 154a and a second semiconductor 154b. This difference will be mainly described.

The gate electrode 124 is positioned on the substrate 110.

The semiconductor layer including the first semiconductor 154a and the second semiconductor 154b overlaps the gate electrode 124 via an intervening gate insulating layer 140 formed between the fate electrode 124 and the semiconductor layer. The first semiconductor 154a and the second semiconductor 154b include an oxide semiconductor, and the first semiconductor 154a and the second semiconductor 154b contact each other. Here, the first semiconductor 154a indicates an oxide semiconductor layer closer to the gate insulating layer 140 than the second semiconductor 154b.

In the present exemplary embodiment, the gate insulating layer 140 may be positioned on the gate electrode 124, and the first semiconductor 154a and the second semiconductor 154b may be positioned on the gate insulating layer 140. In the present exemplary embodiment, the second semiconductor 154b is positioned on the first semiconductor 154a, and the plan view of the first semiconductor 154a and the second semiconductor 154b are substantially the same. The second semiconductive element 154b may have protrusion protruded from the edge of the first semiconductive element 154a. The protrusion may surround the first semiconductive element 154a in a plan view.

The first semiconductor 154a and the second semiconductor 154b may have different compositions. According to the present exemplary embodiment, the second semiconductor 154b includes at least one additional element X that is not included in the first semiconductor 154a, and the additional element X includes gallium (Ga).

The first semiconductor 154a may include oxides formed from indium (In), tin (Sn), and zinc (Zn). The first semiconductive element 154a may include all oxides formed from indium (In), tin (Sn), and zinc (Zn). That is, the first semiconductor 154a includes indium-zinc-tin-oxide (IZTO).

The second semiconductor 154b includes oxides formed from gallium (Ga), indium (In), tin (Sn), and zinc (Zn). The second semiconductive element 154b may include all oxides formed from gallium Ga, indium (In), tin (Sn), and zinc (Zn). That is, the second semiconductor 154b includes gallium (Ga)-indium (In)-tin (Sn)-zinc (Zn) oxide (GaIZTO).

The second semiconductor 154b may be formed by AC or DC sputtering using an oxide semiconductor target including indium, tin, zinc and gallium.

A content (at. %) of indium included in the second semiconductor 154b may be substantially same as a content (at. %) of indium included in the first semiconductor 154a.

The first semiconductor 154a and the second semiconductor 154b may be simultaneously wet-etched by a wet metal etchant such as copper (Cu) etchant. The first semiconductor 154a and the second semiconductor 154b may have substantially the same etching rates in the wet metal etchant.

Figure 27:
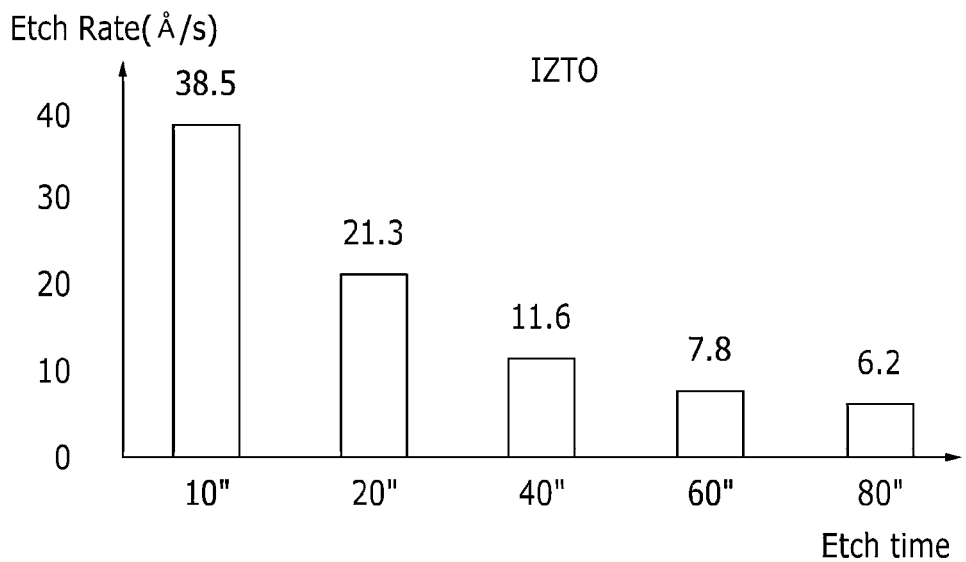
FIG. 27 is a graph showing an etching rate of a semiconductor layer including IZTO according to an etching time.
Figure 28:
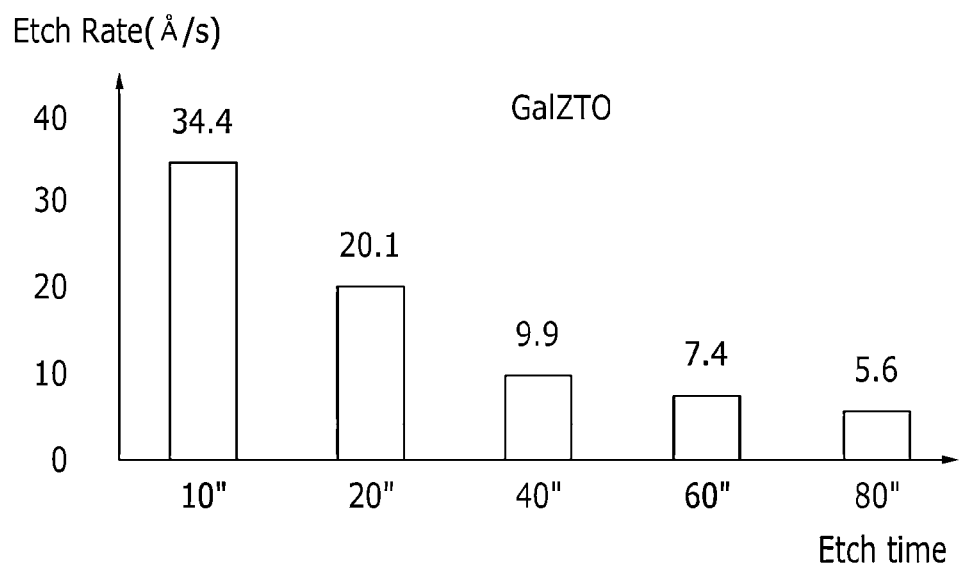
FIG. 28 is a graph showing an etching rate of a semiconductor layer including GaIZTO according to an etching time.

FIG. 27 is a graph showing an etching rate of a semiconductor layer including IZTO according to an etch time, and FIG. 28 is a graph showing an etching rate of a semiconductor layer including GaIZTO according to an etch time, FIG. 27 and FIG. 28 show etching rates when a ratio of the content (which is referred to as "content ratio") of zinc (Zn) to the content of tin (Sn) included in indium-tin-zinc oxide (IZTO) and a ratio of the content of zinc (Zn) to the content of tin (Sn) included in gallium-indium-tin-zinc oxide (GaIZTO) are substantially the same.

Referring to FIG. 27 and FIG. 28, it may be confirmed that the wet etching rates in the wet metal etchant are almost the same if the content ratio of zinc (Zn) to tin (Sn) in indium-tin-zinc oxide (IZTO) and gallium-indium-tin-zinc oxide (GaIZTO) are substantially the same.

Figure 29:
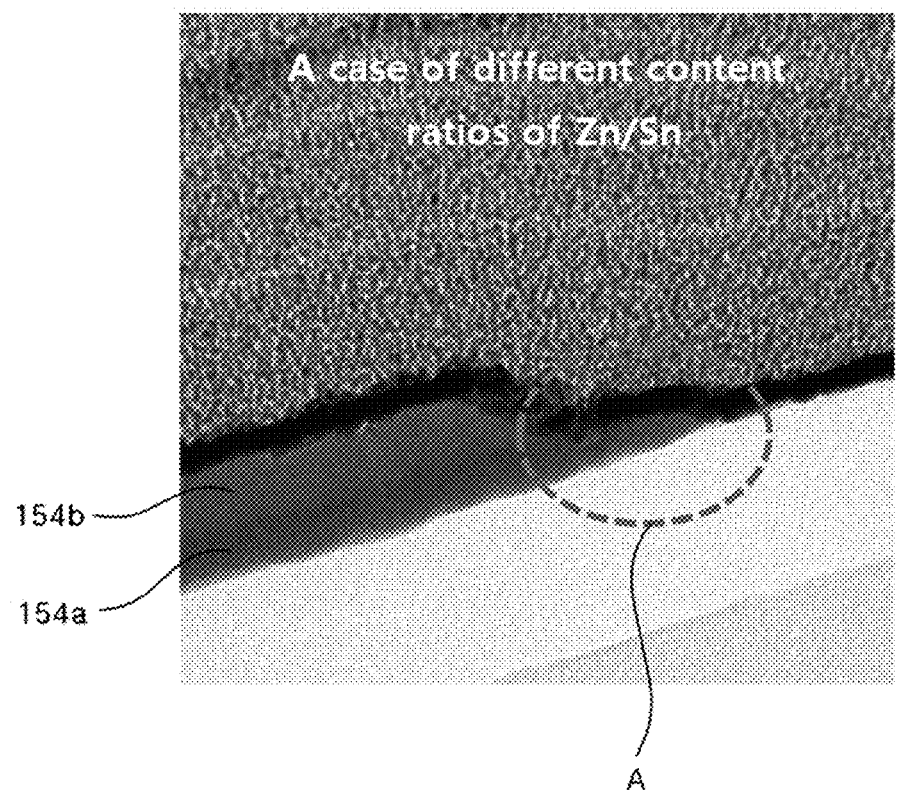
FIG. 29 is a picture showing a cross-section of etched first and second semiconductors 154a and 154b when ratios of zinc to tin included in the first and second semiconductors 154a and 154b of a thin film transistor are different from each other.
Figure 30:
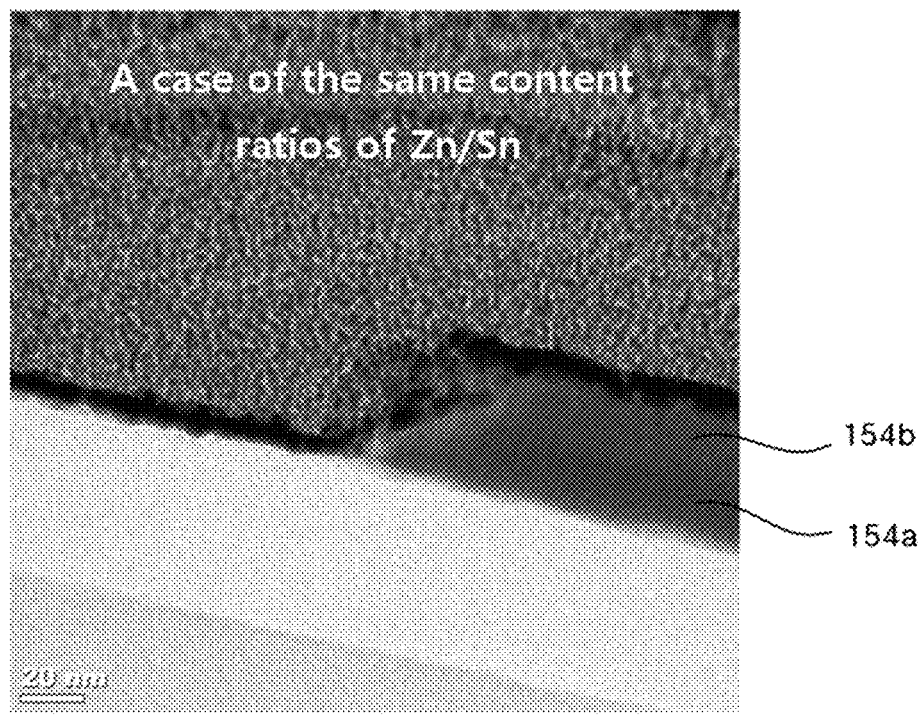
FIG. 30 is a picture showing a cross-section of etched first and second semiconductors 154a and 154b when ratios of zinc to tin included in the first and second semiconductors 154a and 154b of a thin film transistor are substantially equal to each other.

FIG. 29 is a picture showing a cross-section of etched first and second semiconductors 154a and 154b of a conventional art when ratios of zinc to tin included in the first and second semiconductors 154a and 154b of a thin film transistor are different from each other, and FIG. 30 is a picture showing a cross-section of etched first and second semiconductors 154a and 154b when ratios of zinc to tin included in the first and second semiconductors 154a and 154b of a thin film transistor are substantially equal to each other.

Referring to FIG. 29, if the etching rates of the first semiconductor 154a is much lower than that of the second semiconductors 154b, in the etched first and second semiconductors 154a and 154b, as shown in a portion A of FIG. 29, edge of the first semiconductor 154a may be protruded to outside of the second semiconductors 154b too much such that a big skew may be generated.

On the other hands, if the etching rates for one etchant of the first semiconductor 154a is much faster than that of the second semiconductors, edge of the first semiconductor 154a may be recessed to inside of the second semiconductors 154b such that an undercut (not shown) may be generated.

However, referring to FIG. 30, like an exemplary embodiment of the inventive concept, an etching rate of the first semiconductor 154a and the second semiconductor 154b is substantially the same such that only a small skew is generated in the edge of the patterned first semiconductor 154a and second semiconductor 154b and no undercut is generated. The edges of the first semiconductor 154a and the second semiconductor 154b may be almost aligned. Accordingly, a defect of the thin film transistor by the edge misalignment of the first semiconductor 154a and the second semiconductor 154b may be prevented.

That is, in the manufacturing process of the thin film transistor, the content ratio of zinc (Zn) to tin (Sn) included in the second semiconductor 154b and the content ratio of the zinc (Zn) to tin (Sn) included in the first semiconductor 154a may be controlled substantially equal to each other. Thus the etching rates of the first semiconductor 154a and the second semiconductor 154b in the same etchant may be controlled to be substantially equal to each other.

According to an exemplary embodiment of the inventive concept, the content of gallium (Ga) included in the second semiconductor 154b is greater than 0 at. % and less than or equal to about 33 at. %. Accordingly, the thin film transistor including the first semiconductor 154a and the second semiconductor 154b as the channel layer may have high mobility while increasing photovoltaic reliability.

This will be described with reference to FIG. 31 and FIG. 32.

Figure 31:
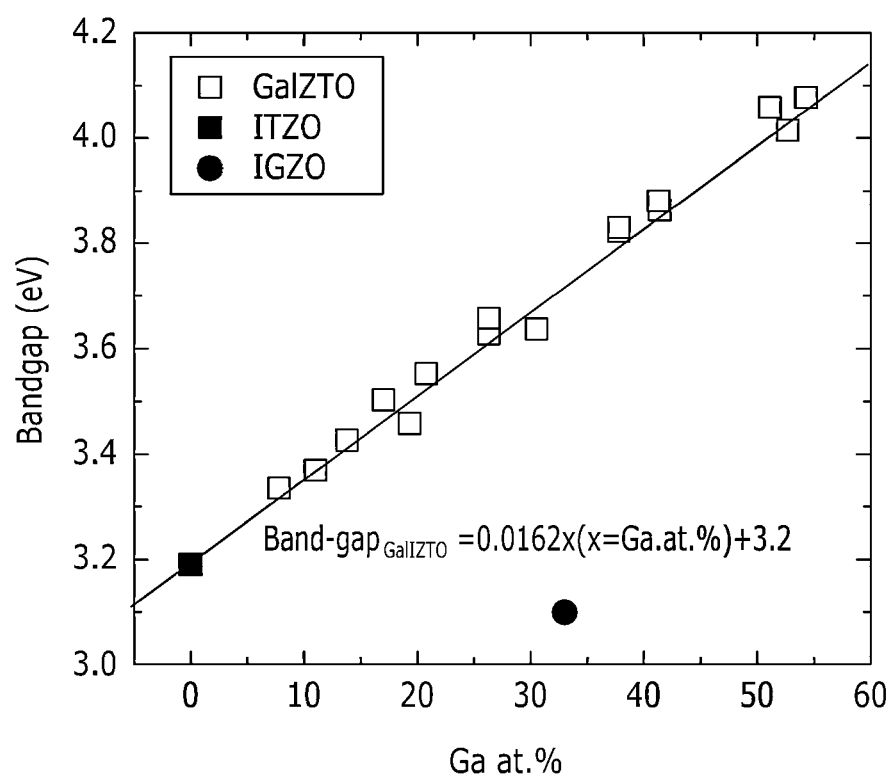
FIG. 31 is a graph showing a bandgap according to a content of gallium (Ga) included in a thin film transistor according to several exemplary embodiments of the inventive concept.
Figure 32:
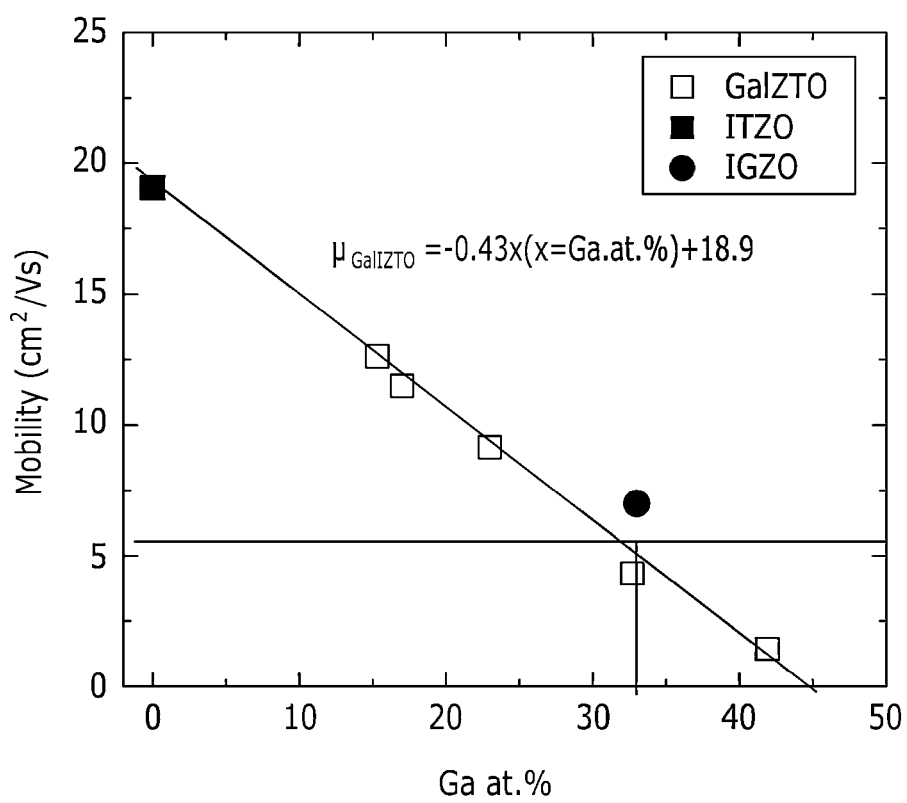
FIG. 32 is a graph showing mobility according to a content of gallium (Ga) included in a thin film transistor according to several exemplary embodiments of the inventive concept.

FIG. 31 is a graph showing a bandgap according to a content of gallium (Ga) included in a thin film transistor according to several exemplary embodiments of the inventive concept, and FIG. 32 is a graph showing mobility according to a content of gallium (Ga) included in a thin film transistor according to several exemplary embodiments of the inventive concept.

Referring to FIG. 31, as the content (at. %) of gallium (Ga) included in the second semiconductor 154b increases, a bandgap (eV) of the second semiconductor 154b increases such that an influence of light decreases. Accordingly, as the content (at. %) of gallium (Ga) included in the second semiconductor 154b increases, a shift of a threshold voltage (Vth) of the thin film transistor may decrease and the photovoltaic reliability may be improved.

In contrast, referring to FIG. 32, as the content (at. %) of gallium (Ga) included in the second semiconductor 154b increases, the mobility of the second semiconductor 154b decreases. To normally operate the thin film transistor according to an exemplary embodiment of the inventive concept, by considering that the mobility of the second semiconductor 154b may be about 5 cm$^2$/Vs at a minimum, as shown in the graph of FIG. 32, the content of the gallium (Ga) included in the second semiconductor 154b must be about 33 at. % at a maximum. That is, by controlling the content of gallium (Ga) included in the second semiconductor 154b to be greater than 0 at. % and less than or equal to about 33 at. %, the high mobility may be obtained while increasing the photovoltaic reliability of the second semiconductor 154b.

As described in an exemplary embodiment of the inventive concept, if the second semiconductor 154b further includes gallium (Ga) that is not included in the first semiconductor 154a, the components of the first semiconductor 154a and the second semiconductor 154b may be prevented from being moved or mixed in the boundary between the first semiconductor 154a and the second semiconductor 154b, and a interfacial layer may be prevented from being generated in the boundary portion between the first semiconductor 154a and the second semiconductor 154b. Particularly, as described above, if the content of gallium (Ga) included in the second semiconductor 154b is more than or equal to about 1 at. % and less than or equal to about 33 at. %, the components of the first semiconductor 154a and the second semiconductor 154b may be surely prevented from being mixed with each other.

Each thickness of the first semiconductor 154a and the second semiconductor 154b may be more than or equal to 5 Å and less than or equal to 600 Å, but is not limited thereto.

Also, the oxide semiconductor included in the first semiconductor 154a and the second semiconductor 154b may be amorphous, crystalline, nano-sized crystalline, or a mixture of two or more thereof.

Also, the description for the source electrode 173, the drain electrode 175, and the passivation layer 180 is the same as most of the described exemplary embodiment such that the detailed description thereof is omitted.

According to the composition of the second semiconductor 154b according to an exemplary embodiment of the inventive concept, the metal component of the source electrode 173 and the drain electrode 175 may be prevented from being diffused into the second semiconductor 154b or the first semiconductor 154a even if a diffusion barrier layer (not shown) is not additionally formed between the second semiconductor 154b and the source electrode 173 and drain electrode 175. Particularly, if the content of gallium (Ga) included in the second semiconductor 154b is more than or equal to about 1 at. % and less than or equal to 33 at. %, the metal component such as copper (Cu) of the source electrode 173 and the drain electrode 175 may be surely prevented from being diffused into the second semiconductor 154b or the first semiconductor 154a. Accordingly, the characteristic of the thin film transistor is not deteriorated although the source electrode 173 and the drain electrode 175 are formed of the single layer made of copper (Cu) without an intervening diffusion barrier between the source electrode 173/the drain electrode 175 and the second semiconductor 154b.

The structure of the thin film transistor according to an exemplary embodiment of the inventive concept is not limited thereto, and the first semiconductor 154a and the second semiconductor 154b according to an exemplary embodiment of the inventive concept may be applied to thin film transistors according to various structures and manufacturing methods. For example, the characteristics of the first and second semiconductors 154a and 154b according to the present exemplary embodiment may be equally applied to the thin film transistor according to the exemplary embodiment shown in FIG. 4 to FIG. 6.

Next, the manufacturing method of the thin film transistor according to an exemplary embodiment of the inventive concept will be described with reference to FIG. 7 to FIG. 11.

Figure 7:
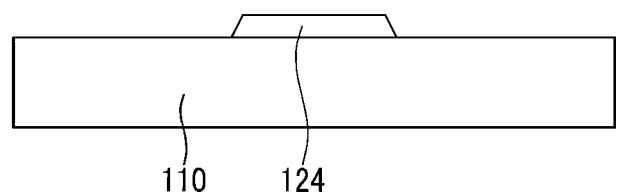
FIG. 7 to FIG. 11 are cross-sectional views sequentially showing a manufacturing method of the thin film transistor shown in FIG. 5.

Firstly, referring to FIG. 7, the gate electrode 124 is formed on the substrate 110.

Figure 8:
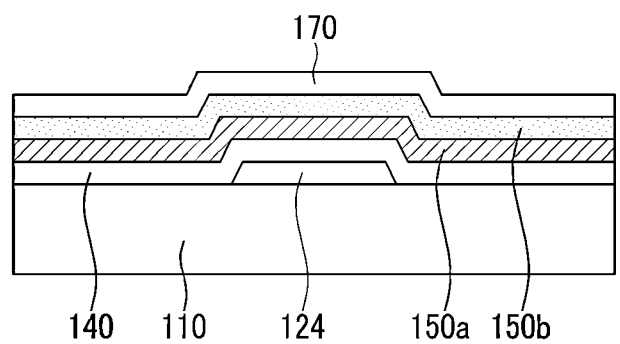

Next, referring to FIG. 8, the gate insulating layer 140 is formed on the gate electrode 124, and the first semiconductor layer 150a and the second semiconductor layer 150b, and a conductive layer 170, are sequentially deposited.

The first semiconductor layer 150a may be formed by the sputtering method using the oxide semiconductor target including the oxides including indium (In), tin (Sn), and zinc (Zn).

The second semiconductor layer 150b may be formed by the sputtering method using the oxide semiconductor target including the oxides including indium (In), tin (Sn), zinc (Zn), and gallium (Ga). The content of gallium (Ga) included in the second semiconductor layer 150b may be in the range of more than or equal to 1 at. % to less than or equal to 33 at. %.

The conductive layer 170 may be formed by the sputtering method using the target made of the metal such as copper (Cu).

Figure 9:
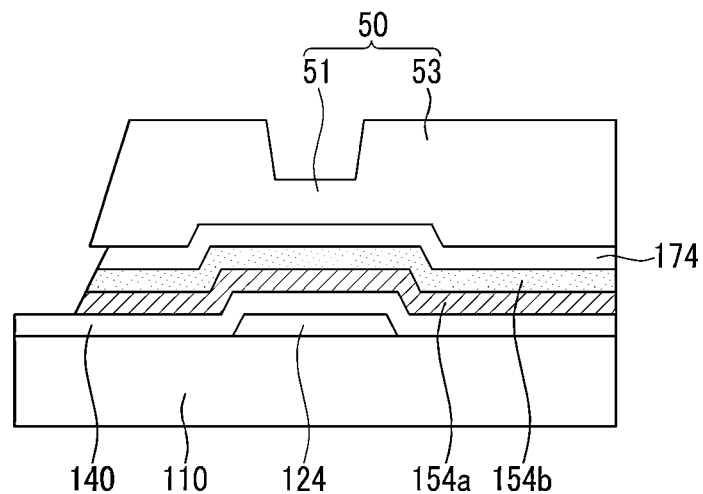

Next, referring to FIG. 9, a photosensitive film 50 including a first portion 51 having a relatively thin thickness and a second portion 53 having a relatively thick thickness is formed on the conductive layer 170. The first portion 51 may overlap a portion of the gate electrode 124 and correspond to a channel region of the thin film transistor.

The first semiconductor layer 150a, the second semiconductor layer 150b, and the conductive layer 170 are etched to form the first semiconductor 154a, the second semiconductor 154b, and a conductor layer 174 patterns using the photosensitive film 50 as an etching mask. At this time, the wet etching may be used. The etchant used to form the patterns may be an etchant that is capable of etching the conductive layer 170, the first semiconductor layer 150a, and the second semiconductor layer 150b together.

The content ratio of zinc (Zn) to tin (Sn) included in the first semiconductor 154a and the content ratio of zinc (Zn) to tin (Sn) included in the second semiconductor 154b are substantially the same such that the second semiconductor 154b and the first semiconductor 154a may be simultaneously etched at a substantially same etch rate, and as described in FIG. 30, the edges of the first semiconductor 154a and the second semiconductor 154b may be patterned to be aligned.

Next, referring to FIG. 10, the first portion 51 having the thin thickness of the photosensitive film 50 is removed. At this time, the thickness of the second portion 53 is decreased during the removal of the first portion 51 thereby forming a photosensitive film 53'.

Next, referring to FIG. 11, by using the photosensitive film 53' as an etching mask, the conductor layer 174 is patterned to form a separated source electrode 173 and the drain electrode 175.

Next, the photosensitive film 53' is removed, and as shown in FIG. 5, the passivation layer 180 of the insulating material is formed on the source electrode 173 and the drain electrode 175. After forming the insulating material for the passivation layer 180 on the source electrode 173, the drain electrode 175, and the exposed second semiconductor 154b, to improve the characteristics of the thin film transistor, the heat treatment may be performed at a high temperature or annealing may be performed. At this time, since the content of gallium (Ga) included in the second semiconductor 154b is more than or equal to about 1 at. % to less than or equal to about 33 at. %, the components of the first semiconductor 154a and the second semiconductor 154b formed by the manufacturing method according to an exemplary embodiment of the inventive concept are not mixed even after the heat treatment and the first semiconductor 154a and the second semiconductor 154b are separated from each other. Also, the third layer is not formed between the first semiconductor 154a and the second semiconductor 154b such that the characteristic of the thin film transistor may be improved.

In addition, the thin film transistor including the first semiconductor 154a and the second semiconductor 154b according to the several exemplary embodiments of the inventive concept may have various structures, and the first semiconductor 154a and second semiconductor 154b of an exemplary embodiment of the inventive concept may be applied to various display panels and various display devices. Also, the manufacturing method of the first semiconductive element 154a and the second semiconductive element 154b according to an exemplary embodiment of the present disclosure is not limited to the specific examples given, and may vary depending on various manufacturing methods and various process conditions.

While this disclosure has been described in connection with what are presently considered to be practical exemplary embodiments, it is to be understood that the disclosure is not limited to the disclosed embodiments, but, on the contrary, is intended to cover various modifications and equivalent arrangements included within the spirit and scope of the present teachings.

What is claimed is:

1. A thin film transistor comprising:
a gate electrode;
a gate insulating layer positioned on or under the gate electrode;
a first oxide semiconductor and a second oxide semiconductor that overlap the gate electrode with the gate insulating layer interposed therebetween, an overlapping area of the first oxide semiconductor and the gate electrode being substantially the same as an overlapping area of the second oxide semiconductor and the gate electrode, a composition of the second oxide semiconductor being different from a composition of the first oxide semiconductor;
a source electrode connected to the second oxide semiconductor, the source electrode contacting an upper surface of the second oxide semiconductor, the upper surface being a surface opposite to an interface between the first oxide semiconductor and the second oxide semiconductor; and
a drain electrode connected to the second oxide semiconductor and facing the source electrode,
wherein the second oxide semiconductor includes gallium (Ga) and the first oxide semiconductor does not include gallium, and
a content of gallium (Ga) in the second oxide semiconductor is greater than 0 at. % and less than or equal to about 33 at. %.

2. The thin film transistor of claim 1, wherein
the first oxide semiconductor and the second oxide semiconductor respectively include indium (In)-tin (Sn)-zinc (Zn) oxide (IZTO).

3. The thin film transistor of claim 2, wherein
a content ratio of zinc (Zn) to tin (Sn) included in the first oxide semiconductor is substantially the same as a content ratio of zinc (Zn) to tin (Sn) included in the second oxide semiconductor.

4. The thin film transistor of claim 3, wherein
etch rates of the first oxide semiconductor and the second oxide semiconductor in a same etchant are substantially the same.

5. The thin film transistor of claim 2, wherein
etch rates of the first oxide semiconductor and the second oxide semiconductor in a same etchant are substantially the same.

6. The thin film transistor of claim 1,
wherein the first oxide semiconductor and the second oxide semiconductor include tin (Sn) and zinc, and
wherein a content ratio of zinc (Zn) to tin (Sn) included in the first oxide semiconductor is substantially the same as a content ratio of zinc (Zn) to tin (Sn) included in the second oxide semiconductor.

7. The thin film transistor of claim 6, wherein
etch rates of the first oxide semiconductor and the second semiconductor in a same etchant are substantially the same.

8. The thin film transistor of claim 6, wherein
etching rates of the first oxide semiconductor and the second oxide semiconductor in a same etchant are substantially the same.

9. A thin film transistor array panel comprising the thin film transistor of claim 1.

10. A thin film transistor comprising:
a gate electrode;
a semiconductive layer overlapping the gate electrode with a gate insulating layer interposed between the gate electrode and the semiconductive layer, wherein the semiconductive layer includes a first semiconductor and a second semiconductor, an overlapping area of the first semiconductor and the gate electrode being substantially the same as an overlapping area of the second semiconductor and the gate electrode, a composition of the second semiconductor being different from a composition of the first semiconductor;
a source electrode connected to the second semiconductor; and
a drain electrode connected to the second semiconductor and facing the source electrode,
wherein the first semiconductor and the second semiconductor include tin and zinc, and
wherein a content ratio of zinc (Zn) to tin (Sn) included in the first semiconductor is substantially the same as a content ratio of zinc (Zn) to tin (Sn) included in the second semiconductor, and
wherein the second semiconductor includes gallium (Ga), and the first semiconductor does not include gallium.

11. The thin film transistor of claim 10, wherein
the second semiconductor includes gallium (Ga) that is not included in the first semiconductor, and
a content of gallium (Ga) in the second semiconductor is greater than 0 at. % and less than or equal to about 33 at. %.

12. The thin film transistor of claim 11, wherein
the first semiconductor and the second semiconductor respectively include indium (In)-tin (Sn)-zinc (Zn) oxide (IZTO).

13. The thin film transistor of claim 12, wherein
etch rates of the first semiconductor and the second semiconductor in a same etchant are substantially the same.

14. The thin film transistor of claim 11, wherein
etch rates of the first semiconductor and the second semiconductor in a same etchant are substantially the same.

15. The thin film transistor of claim 10, wherein
the first semiconductor and the second semiconductor respectively include indium (In)-tin (Sn)-zinc (Zn) oxide (IZTO).

16. The thin film transistor of claim 15, wherein
etch rates of the first semiconductor and the second semiconductor in a same etchant are substantially the same.

17. The thin film transistor of claim 10, wherein
etch rates of the first semiconductor and the second semiconductor in a same etchant are substantially the same.

* * * * *